(12) United States Patent
Jung et al.

(10) Patent No.: US 10,385,837 B2
(45) Date of Patent: Aug. 20, 2019

(54) ELECTRIC COMPRESSOR

(71) Applicant: Hanon Systems, Daejeon (KR)

(72) Inventors: Min Gyo Jung, Daejeon (KR); Tae Hyoung Kim, Daejeon (KR); Sung Jun Park, Daejeon (KR); Hee Kwon Park, Daejeon (KR); Seung Hwan Shin, Daejeon (KR); Young Hun Lee, Daejeon (KR)

(73) Assignee: HANON SYSTEMS, Daejeon (KR)

( * ) Notice: Subject to any disclaimer, the term of this patent is extended or adjusted under 35 U.S.C. 154(b) by 148 days.

(21) Appl. No.: 15/024,448

(22) PCT Filed: Aug. 27, 2015

(86) PCT No.: PCT/KR2015/008995
§ 371 (c)(1),
(2) Date: Mar. 24, 2016

(87) PCT Pub. No.: WO2016/032259
PCT Pub. Date: Mar. 3, 2016

(65) Prior Publication Data
US 2017/0167480 A1    Jun. 15, 2017

(30) Foreign Application Priority Data

Aug. 29, 2014 (KR) .................. 10-2014-0114227
Jun. 10, 2015 (KR) .................. 10-2015-0081968

(51) Int. Cl.
*F04B 39/06* (2006.01)
*F04C 29/04* (2006.01)
(Continued)

(52) U.S. Cl.
CPC .............. *F04B 39/06* (2013.01); *F04B 35/04* (2013.01); *F04C 29/04* (2013.01); *F04C 29/047* (2013.01);
(Continued)

(58) Field of Classification Search
CPC .. F04C 29/047; F04C 29/04; F04C 2240/808; F04C 23/008; F04B 35/04; F04B 39/06; H05K 7/209
See application file for complete search history.

(56) References Cited

U.S. PATENT DOCUMENTS 5,946,192 A * 8/1999 Ishigami ............ H05K 7/20418
257/719
6,943,293 B1 * 9/2005 Jeter ..................... H01L 23/473
174/548
(Continued)

FOREIGN PATENT DOCUMENTS

JP   2008091558 A    4/2008
JP   2011163148 A    8/2011
(Continued)

*Primary Examiner* — Charles G Freay
(74) *Attorney, Agent, or Firm* — Shumaker, Loop & Kendrick, LLP; James D. Miller

(57) ABSTRACT

Disclosed herein is an electric compressor including: a main housing (4) having therein a suction chamber into which low-temperature refrigerant is drawn; an inverter housing (1) including an internal seating surface (1a) formed adjacent to the suction chamber, with at least one inverter element (2) fixed at a surface thereof to the internal seating surface (1a) while making contact with the internal seating surface (1a), the at least one inverter element (2) conducting heat to the main housing (4); and at least one heat dissipation cover (6) disposed toward the main housing (4) while facing another surface of the inverter element (2) and enclosing the inverter element (2), the at least one heat dissipation cover (6) having therein a receiving space (64) in which the inverter element (2) is received.

17 Claims, 18 Drawing Sheets

(51) Int. Cl.
  *H05K 7/20* (2006.01)
  *F04B 35/04* (2006.01)
  *F04C 23/00* (2006.01)

(52) U.S. Cl.
  CPC ............ *H05K 7/209* (2013.01); *F04C 23/008* (2013.01); *F04C 2240/808* (2013.01)

(56) References Cited

U.S. PATENT DOCUMENTS

| | | | | |
|---|---|---|---|---|
| 9,474,189 | B2* | 10/2016 | Kawauchi | H02M 7/003 |
| 2011/0189035 | A1* | 8/2011 | Nakagami | F04B 39/06 |
| | | | | 417/410.5 |
| 2011/0193452 | A1 | 8/2011 | Yakushiji | |
| 2012/0183823 | A1* | 7/2012 | Von Borck | H01M 2/1061 |
| | | | | 429/81 |
| 2012/0229984 | A1* | 9/2012 | Guo | H05K 7/209 |
| | | | | 361/704 |
| 2013/0277820 | A1* | 10/2013 | Hotta | H01L 23/4006 |
| | | | | 257/712 |

FOREIGN PATENT DOCUMENTS

| | | |
|---|---|---|
| KR | 20110039785 A | 4/2011 |
| KR | 20130104578 A | 9/2013 |
| KR | 20140057735 A | 5/2014 |
| WO | 2012035767 A1 | 3/2012 |

\* cited by examiner

ELECTRIC COMPRESSOR

CROSS-REFERENCE TO RELATED APPLICATIONS

This patent application is a United States national phase patent application based on PCT/KR2015/008995 filed Aug. 27, 2015 which claims the benefit of Korean Patent Application No. 10-2014-0114227 filed Aug. 29, 2014 and Korean Patent Application No. 10-2015-0081968 filed Jun. 10, 2015. The entire disclosures of the above patent applications are hereby incorporated herein by reference.

TECHNICAL FIELD

Exemplary embodiments of the present invention relate to an electric compressor, and more particularly, to an electric compressor which is provided using a heat dissipation cover having therein a receiving space for reception of an inverter element so that heat generated from a heat-generating element can be removed in a double dissipation manner, and leading-out of a terminal of the element can be facilitated.

BACKGROUND OF THE INVENTION

Generally, compressors for compressing refrigerant in air conditioning systems for vehicles have been developed in various forms. Following the recent trend of using electric apparatuses as parts of vehicles, development of an electric compressor which is operated with electricity using a motor has become appreciably more active.

The motor of the electric compressor is typically configured to be adjusted in output by an inverter. However, because the electric compressor is operated with electricity, the motor and the inverter constituting the electric compressor generate heat, and the generated heat significantly affects the performance of the motor and the inverter. In an effort to overcome such a heating problem, various alternatives have been introduced.

With regard to cooling of the motor, a configuration is typically employed, in which refrigerant to be compressed directly flows around a portion of a main housing in which the motor is disposed, and thus absorbs heat generated from the motor.

However, in the case of cooling of the inverter, a plurality of heat-generating switching elements (hereinafter, referred to as inverter elements) such as IGBTs (insulated gate bipolar mode transistors) are included in the inverter. Because such inverter elements have low durability, a method of cooling the inverter elements by making refrigerant flow directly therearound in a similar manner to that of the cooling of the motor is not preferable.

A conventional inverter element installation structure will be described with reference to the related drawings.

Referring to FIGS. 1 to 2, a plurality of inverter elements 2 are mounted on a seating surface 1a in an inverter housing 1 in such a way that one surface of each inverter element 2 faces the seating surface 1a. The inverter housing 1 is configured to come into close contact with a suction chamber (not shown) formed in a main housing 4 so that heat generated from each inverter element 2 is conducted to the suction chamber of the main housing 4 through the one surface of the inverter element and the inverter housing 1, and heat generated from the other surface of each inverter element 2 is transferred to air in the inverter housing 1 by convection.

However, in the shown configuration, heat generated from each inverter element 2 is transferred to the inverter housing 1 by conduction only through the one surface of the inverter element 2, that is, through the surface of the inverter element 2 that is attached to the seating surface 1a of the inverter housing 1. Otherwise, heat is transferred from each inverter element 2 to air in the inverter housing 1 by convection. Therefore, heat generated from the inverter elements 2 cannot be effectively dissipated. Consequently, the overall efficiency of the inverter is reduced, and a serious problem of the inverter element 2 being even damaged by overheating may be caused.

Furthermore, when the plurality of inverter elements 2 are mounted on the seating surface 1a, there is the need for a separate jig to be used to individually set the locations of the inverter elements 2. Therefore, there is a problem in that a process of manufacturing the electric compressor is complicated.

SUMMARY OF THE INVENTION

An embodiment of the present invention relates to an electric compressor which is capable of maximizing the efficiency of cooling inverter elements using a heat dissipation cover that functions to increase the heat transfer area of the inverter elements, and in which an internal space of the heat dissipation cover is partitioned into a plurality of receiving spaces, and the inverter elements are fixed to the inverter housing while being disposed in the respective receiving spaces, so that a separate installation jig is not required, whereby an installation process can be simplified.

Technical Solution

An electric compressor in accordance with a first embodiment of the present invention may include: a main housing (4) having therein a suction chamber into which low-temperature refrigerant is drawn; an inverter housing (1) including an internal seating surface (1a) formed adjacent to the suction chamber, with at least one inverter element (2) fixed at a surface thereof to the internal seating surface (1a) while making contact with the internal seating surface (1a), the at least one inverter element (2) conducting heat to the main housing (4); and at least one heat dissipation cover (6) disposed toward the main housing (4) while facing another surface of the inverter element (2) and enclosing the inverter element (2), the at least one heat dissipation cover (6) having therein a receiving space (64) in which the inverter element (2) is received.

The at least one heat dissipation cover (6) may be configured in a shape in which: lower and front portions thereof are open; an upper portion thereof is closed by an upper plate (63) formed at a position spaced apart from the seating surface (1a) by a predetermined distance; both side portions thereof are respectively closed by a left side plate (61a) and a right side plate (61b) that are bent from the upper plate (63) toward the seating surface (1a); and a rear portion thereof is closed by a rear side plate (61c) bent from the upper plate (63) toward the seating surface (1a).

At least one of lower ends of the left side plate (61a), the right side plate (61b) and the rear side plate (61c) may include a first extension part (61aa) that comes into contact with the seating surface (1a) and extends in a direction parallel to the seating surface (1a).

The electric compressor may further include: at least one bolt (7) fixing the inverter element (2) to the seating surface (1a), wherein the at least one heat dissipation cover (6) may have at least one bolt hole (65) through which the at least one bolt (7) passes, and the at least one inverter element (2) may have at least one coupling hole (2d) through which the at least one bolt (7) passes, and wherein as the bolt (7) is tightened, a surface of the inerter element (2) that faces the heat dissipation cover (6) may perform heat transfer in close contact with the heat dissipation cover (6) while heat generated from the inverter element (2) is conducted to the heat dissipation cover (2) through the bolt (7) coupled into the coupling hole (2d).

The at least one heat dissipation cover (6) may include an auxiliary heat dissipation part (10) protruding outward from the heat dissipation cover (6) and configured to dissipate heat generated from the inverter element (2).

The auxiliary heat dissipation part (10) may be formed on each of the upper plate (63), the left side plate (61a), and the right side plate (61b) or on each of all of the upper plate (63), the left side plate (61a), the right side plate (61b), and the rear side plate (61c). The auxiliary heat dissipation part (10) may comprise a plurality of auxiliary heat dissipation parts (10), each having a protrusion shape with a predetermined diameter, or protruding a predetermined length along a lateral direction of the upper plate (63) and having different diameters.

The auxiliary heat dissipation part (10) may further include a heat dissipation protrusion (12) protruding from an upper surface thereof.

The auxiliary heat dissipation part (10) may further include a boss (13) protruding in a lateral direction of one side of the heat dissipation cover (6) and extending toward the seating surface (1a) of the heat dissipation cover (6).

The auxiliary heat dissipation part (10) may include: an extension part (11a) extending along a section of a longitudinal portion of each of heat dissipation covers (6) that are disposed to face each other; a connection part (12a), which is bent upward from both ends of the extension part (11a) of one heat dissipation cover (6), extends horizontally, and is coupled to the extension part (11a) of the other heat dissipation cover (6).

The at least one inverter element (2) may include at least one terminal (2a), (2b), (2c) for signal input and output, wherein the at least one terminal (2a), (2b), (2c) may pass through the open front portion of the heat dissipation cover (6) and extend outside the receiving space (64).

An electric compressor in accordance with a second embodiment of the present invention may include: a main housing (4) having therein a suction chamber into which low-temperature refrigerant is drawn; an inverter housing (1) including an internal seating surface (1a) formed adjacent to the suction chamber, with at least one inverter module (2) fixed at a surface thereof to the internal seating surface (1a) while making contact with the internal seating surface (1a), the inverter module (2) conducting heat to the main housing (4), and being disposed on an upper surface of an insulation sheet (5) disposed on the seating surface (1a), and being provided with a terminal (2a), (2b), (2c) extending upward for signal input and output; and at least one heat dissipation cover (6) disposed toward the main housing (4) while facing another surface of the inverter module (2) and enclosing the inverter module (2), the at least one heat dissipation cover (6) having therein a receiving space (64) in which the inverter module (2) is received, wherein the heat dissipation cover (6) may have an open hole (22), the number of which corresponds to the number of terminal (2a), (2b), (2c), and which is formed at a position facing the terminal (2a), (2b), (2c) so that the terminal (2a), (2b), (2c) is inserted into the open hole (22).

The heat dissipation cover (6) may further include an extension (62) bent at an end thereof toward the insulation sheet (5) disposed on the upper surface of the seating surface (1a).

The at least one heat dissipation cover (6) may include a first heat dissipation cover (6aa) and a second heat dissipation cover (6ab) which have a same shape, and the first heat dissipation cover (6aa) and the second heat dissipation cover (6ab) may be fixed on the seating surface (1a) in such a way that the open front portions thereof face each other.

The at least one heat dissipation cover (6) may be disposed between the left side plate (61a) and the right side plate (61b), and include at least one partition plate (62) partitioning the receiving space (64) into a plurality of spaces.

The at least one partition plate (62) may be configured such that an upper end thereof is coupled to an inner surface of the upper plate (63), and a lower end thereof is brought into contact with the seating surface (1a).

The at least one partition plate (62) may include a second extension part (62a) extending from the lower end of the partition plate (62) in a direction parallel to the seating surface (1a).

The electric compressor may further include at least one guide plate (1b) extending from the seating surface (1a) toward the upper plate (63) of the heat dissipation cover (6), wherein the receiving space (64) may be partitioned by the at least one guide plate (1b) into a plurality of spaces.

The upper plate (63) may have at least one guide slit (66) through which the at least one guide plate (1b) passes and extends.

The electric compressor may further include an insulation sheet (5) provided between a lower surface of the at least one inverter element (2) and the seating surface (1a), wherein the insulation sheet (5) may be omitted between the at least one heat dissipation cover (6) and the seating surface (1a).

The electric compressor may further include a filler (8) provided between an upper surface of the at least one inverter element (2) and an inner surface of the at least one heat dissipation cover (6).

Advantageous Effects

In accordance with the present invention, the efficiency of cooling an inverter element can be maximized using a heat dissipation cover that functions to increase the heat transfer area of the inverter element or module.

Furthermore, an internal space of the heat dissipation cover is partitioned into a plurality of receiving spaces, and inverter elements are fixed to the inverter housing while being disposed in the respective receiving spaces, so that a separate installation jig is not required, whereby an installation process can be simplified.

Various embodiments of the present invention can further enhance the heat dissipation efficiency of the inverter elements using an auxiliary heat dissipation part or boss or a bridge-shaped structure formed on the heat dissipation cover. The heat dissipation cover has an improved structure such that terminals of the inverter elements can be easily led out, and the led-out state of the terminals can be stably maintained.

According to various embodiments of the present invention, in the case where a plurality of inverter elements are provided, a partitioning guide plate is formed in the heat dissipation cover or a seating surface of a main housing, thus increasing the contact area between the inverter elements

DETAILED DESCRIPTION OF EXEMPLARY EMBODIMENTS OF THE INVENTION

Figure 3:
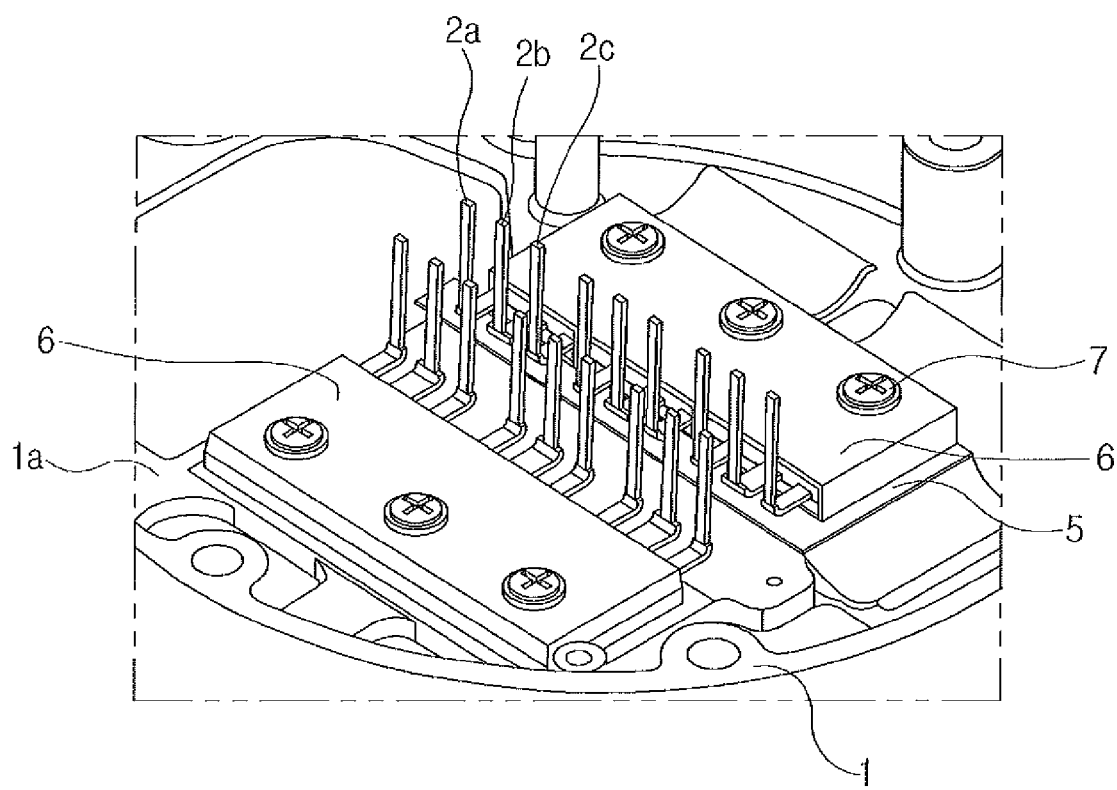
FIG. 3 is a partial enlarged perspective view of an electric compressor including a heat dissipation cover in accordance with a first embodiment of the present invention.
Figure 4:
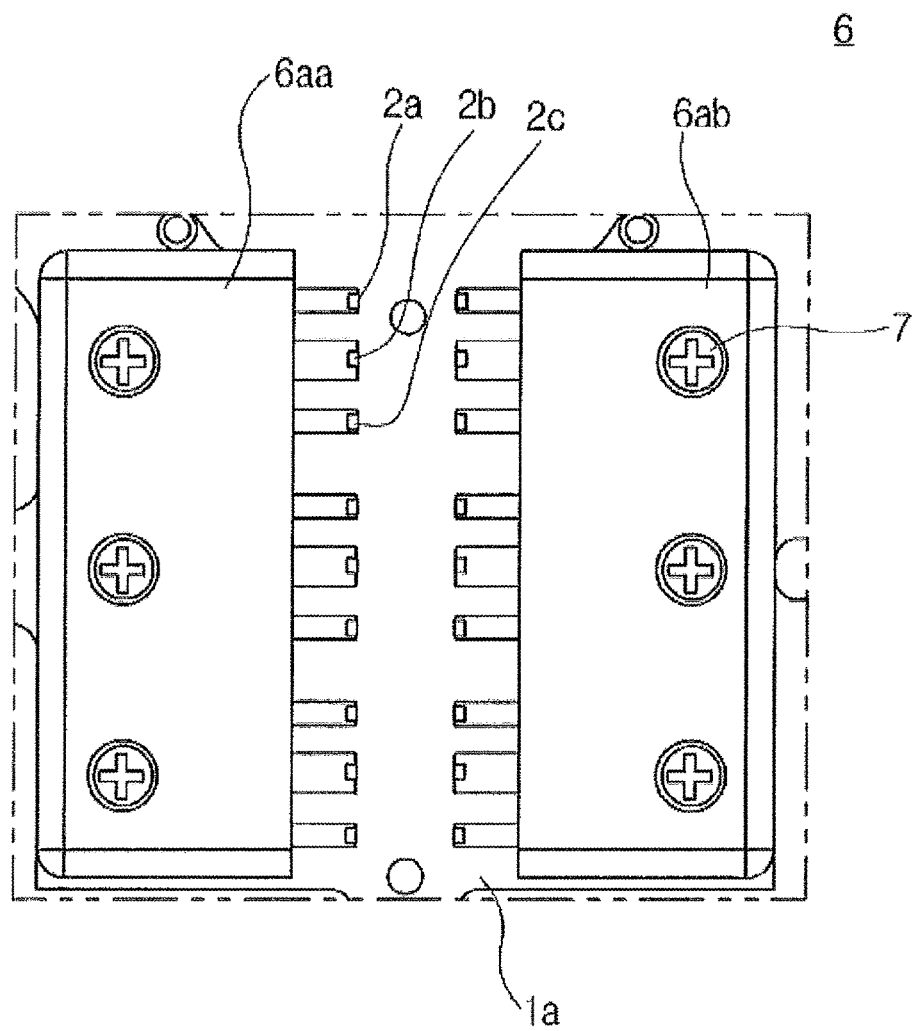
FIG. 4 is a top plan view of the heat dissipation cover of FIG. 3.
Figure 5:
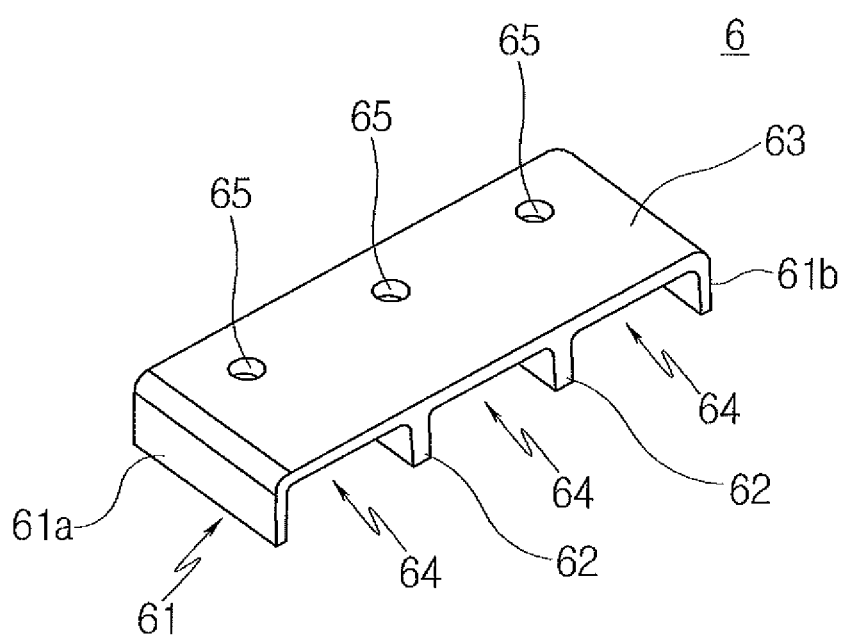
FIGS. 5 to 7 are perspective views illustrating the heat dissipation cover in accordance with the first embodiment of the present invention.

Exemplary embodiments of the present invention will be described with reference to the attached drawings. An electric compressor of the present invention is similar to the electric compressor of the prior art shown in FIGS. 1-2. Reference numerals shown in FIGS. 1-2 will also be used to describe features of the electric compressor of the present invention. For reference, FIG. 3 is a partial enlarged view of an electric compressor including a heat dissipation cover in accordance with a first embodiment of the present invention, FIG. 4 is a plan view of FIG. 3, and FIG. 5 is a perspective view illustrating the heat dissipation cover in accordance with the first embodiment of the present invention.

Figure 1:
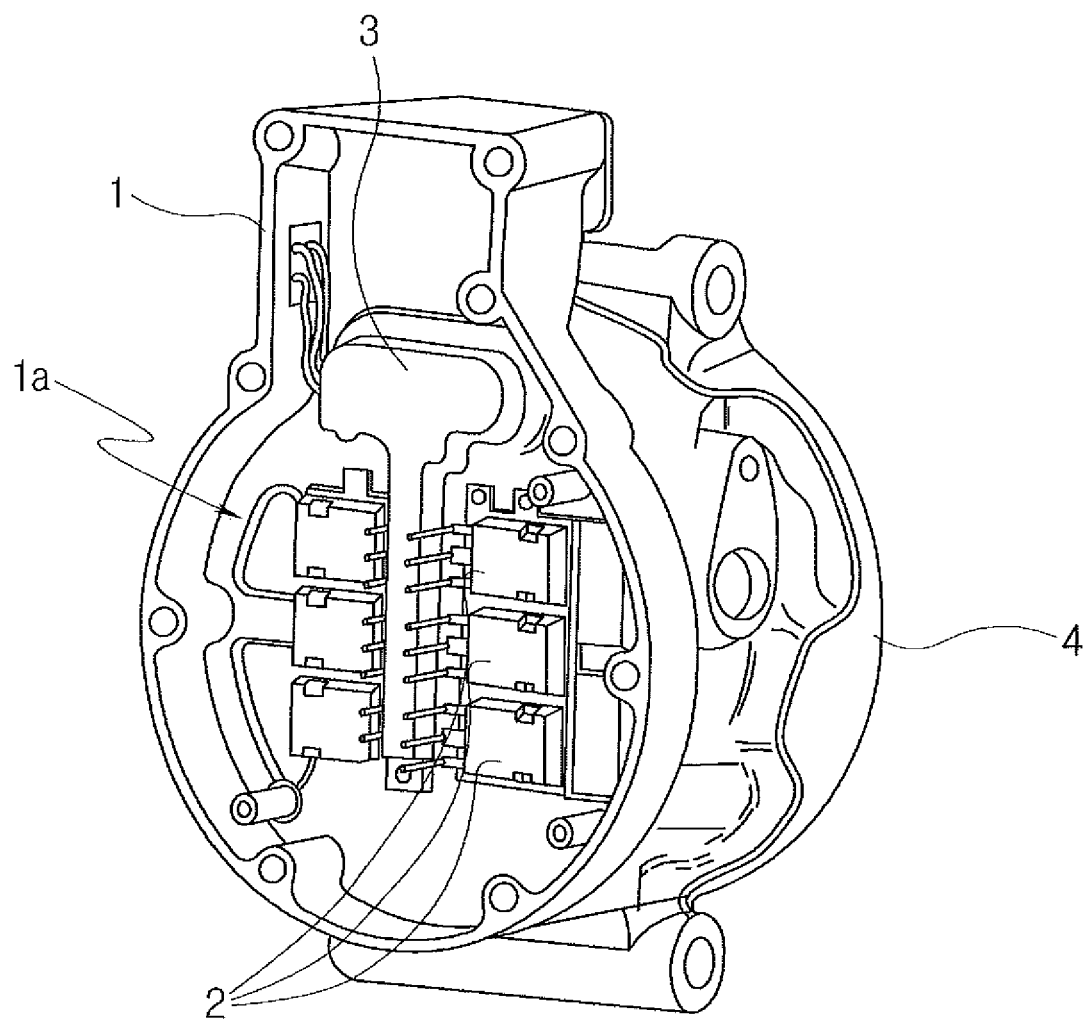
FIG. 1 is a perspective view partially in section illustrating an electric compressor in accordance with a conventional technique.
Figure 2:
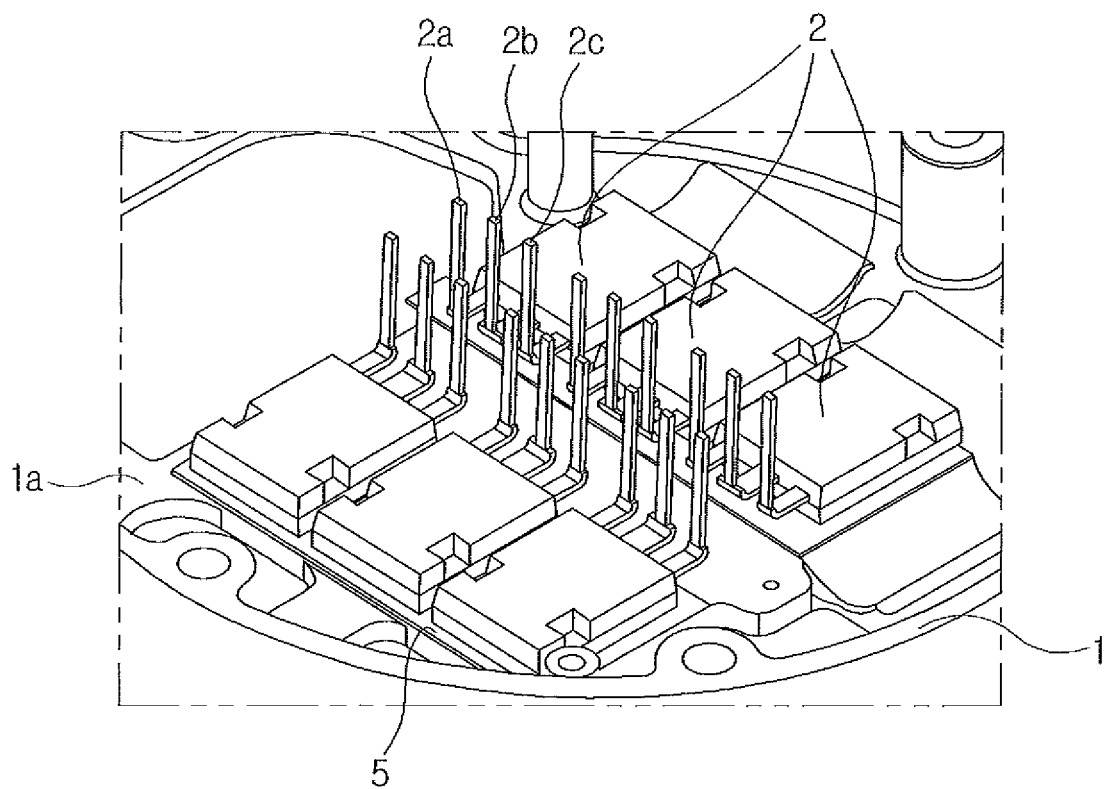
FIG. 2 is a partial enlarged perspective view of an inverter element shown in FIG. 1.

Referring to FIGS. 1-2, the electric compressor in accordance with the first embodiment of the present invention includes a main housing 4 which has therein a suction chamber into which low-temperature refrigerant is drawn; an inverter housing 1 which includes an internal seating surface 1a formed adjacent to the suction chamber, and which is provided with at least one inverter element 2 fixed at a surface thereof to the internal seating surface 1a while making contact with the internal seating surface 1a so that heat is conducted from inverter housing 1 to the main housing 4; and at least one heat dissipation cover 6, which is disposed toward the main housing 4 while facing another surface of the inverter element 2 and enclosing the inverter element 2, and which has therein a receiving space 64 in which the inverter element 2 is received.

Particularly, in the present invention, an upper surface, left and right side surfaces, and a rear surface of the inverter element 2 are enclosed by and are in close contact with the heat dissipation cover 6. Thus, heat generated from the inverter element 2 can be rapidly conducted to the heat dissipation cover 6 and, simultaneously, conducted to the main housing 4 with which the heat dissipation cover 6 makes surface contact. Therefore, the performance of dissipating heat generated from the inverter element 2 can be enhanced.

The main housing 4 has a predetermined internal space and receives in the internal space an electric motor (not shown) and a compression mechanism unit (not shown) which are integrally provided. Furthermore, the internal space includes the suction chamber into which refrigerant to be compressed is introduced, and a discharge chamber through which refrigerant compressed by the compression mechanism unit is discharged to the outside.

Detailed configurations of the electric motor, the compression mechanism unit, the suction chamber, and the discharge chamber are similar to those of the conventional technique shown in FIGS. 1 and 2; therefore, further explanation thereof will be omitted.

The predetermined seating surface 1a is formed in the internal space of the inverter housing 1. The seating surface 1a receives thereon a high-voltage connector 3 to which external power is applied, the inverter element 2, which converts DC power transmitted from the high-voltage connector 3 into AC power and then transmits it to the electric motor, and a control circuit board which is mounted with other circuit elements.

For reference, the seating surface 1a illustrated in the present embodiment is not limited to being formed only in the inverter housing 1. A seating surface may also be formed in the main housing 4 in which the inverter element 2 is seated. However, for the sake of explanation, the after-mentioned seating surface 1a will be described as being formed only in the inverter housing 1.

In the first embodiment, six inverter elements 2 are provided. Disclosed herein is a configuration in which the inverter elements 2 are fixed and installed on the seating surface 1a of the inverter housing 1 in a symmetrical shape based on the high-voltage connector 3. In the same manner as the conventional technique, the seating surface 1a of the inverter housing 1 on which the inverter elements 2 are fixed and installed is configured to be adjacent to the discharge chamber and the suction chamber, into which low-temperature refrigerant is drawn, so that heat generated from the inverter elements 2 can be efficiently transferred to the refrigerant that is drawn into the suction chamber or discharged from the discharge chamber.

The present invention is not limited to the foregoing number and arrangement of inverter elements 2, but for illustrative purposes only, the following description will be based on the configuration illustrated in FIGS. 3-6.

The electric compressor in accordance with the present invention includes the at least one heat dissipation cover 6, which is configured to cover the exposed upper surfaces of the inverter elements 2 so as to enhance the heat dissipation efficiency of the inverter elements, and which is configured to at least partially make direct contact with the seating surface 1a of the inverter housing 1.

The at least one heat dissipation cover 6 in accordance with the present invention has a shape in which: lower and front portions thereof are open; an upper portion thereof is closed by an upper plate 63 which is formed at a position spaced apart from the seating surface 1a of the inverter housing 1 by a predetermined distance; both side portions thereof are respectively closed by a left side plate 61a and a right side plate 61b, which are bent from the upper plate 63 toward the seating surface 1a; and a rear portion thereof is closed by a rear side plate 61c, which is bent from the upper plate 63 toward the seating surface 1a.

As lower ends of the left and right side plates 61a and 61b of the heat dissipation cover 6 and a lower end of the rear side plate 61c of the heat dissipation cover 6 make contact with the seating surface 1a of the inverter housing 1, heat generated from the upper and side surfaces of the inverter elements 2 is directly conducted to the heat dissipation cover 6 and then conducted to the inverter housing 1. Accordingly, there is an effect of increasing the area of heat transfer of the inverter elements 2 by conduction.

A lower surface of the typical inverter element 2 is fixed, by a bolt 7 or the like, to the seating surface 1a with a predetermined insulation sheet 5 interposed therebetween, without coming into direct contact with the inverter housing 1. However, in the heat dissipation cover 6 in accordance with the present invention, the inverter elements 2 are received in the internal receiving space 64, and at least the lower ends of the left and right side plates 61a and 61b and the lower end of the rear side plate 61c of the heat dissipation cover 6 make direct contact with the seating surface 1a without the insulation sheet 5 interposed therebetween. Thereby, the heat conduction efficiency can be enhanced.

In this case, to enhance thermal conductivity, it is preferable that the upper surface of each inverter element 2 be brought into direct contact with an inner surface of the heat dissipation cover 6, in more detail, an inner surface of the upper plate 63.

Because, simultaneously with heat transfer by the conduction, heat transfer by convection through the outer surfaces of the upper plate 63 and the side plates 61 of the heat dissipation cover 6 is made, the present invention also has an effect of markedly increasing the area of heat transfer by convection, compared to the conventional technique.

Furthermore, in the conventional electric compressor, during a manufacturing process in which a plurality of the inverter elements 2 are fixed on the seating surface 1a of the inverter housing 1, a separate jig for setting the locations of the inverter elements 2 has been required. However, in the electric compressor in accordance with the present invention, because receiving spaces 64 that receive the respective inverter elements 2 are defined in the heat dissipation cover 6, a separate jig for setting the locations of the inverter elements 2 is not required.

The material of the heat dissipation cover 6 in accordance with the present invention is not limited, so long as the thermal conductivity thereof is a predetermined degree or more. However, it is preferable that light metal such as aluminum or copper having high thermal conductivity be used so as to maintain the durability of the heat dissipation cover 6 and prevent it from being affected by heat generated from the inverter element 2.

In the embodiment of FIGS. 3 and 4, a total of six inverter elements 2 are fixed on the seating surface 1a of the inverter housing 1, and a first heat dissipation cover 6aa and a second heat dissipation cover 6ab which have the same shape are provided. The first heat dissipation cover 6aa and the second heat dissipation cover 6ab, each of which receives three inverter elements 2 therein, may be fixed on the seating surface 1a of the inverter housing 1 in such a way that the open front portions of the first and second heat dissipation covers 6aa and 6ab face each other.

The present invention is not limited to the foregoing configuration, but for the sake of explanation, the following description will be based on the configuration in which a pair of heat dissipation covers 6 is provided, and three inverter elements 2 are received in each heat dissipation cover 6.

The heat dissipation cover 6 is formed in such a shape that the front portion thereof is open but the rear portion thereof is closed by the rear side plate 61c, and the surface of the inverter element 2 that faces the rear surface 61c is brought into close surface contact with the heat cover 6. Therefore, the heat conduction performance can be enhanced, and even when the inverter element 2 is operated at high temperatures, heat can be rapidly dissipated by conduction. Consequently, the heat dissipation performance can be enhanced.

The at least one inverter element 2 includes at least one terminal 2a, 2b, 2c for signal input and output. The terminal 2a, 2b, 2c extends outside the receiving space 64 through the open front portion of the heat dissipation cover 6.

Figure 6:
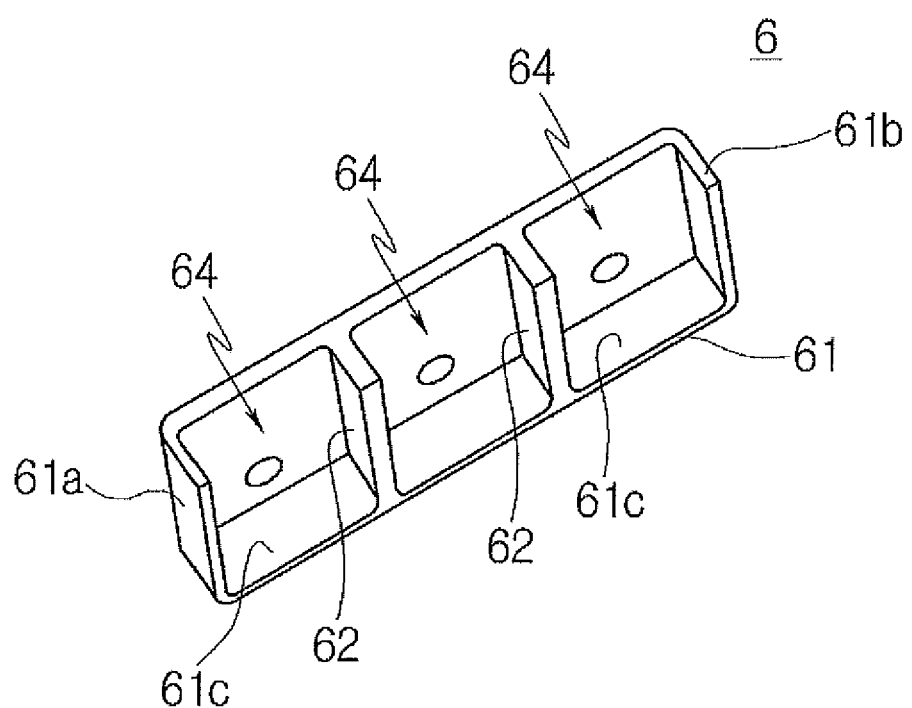
Figure 7:
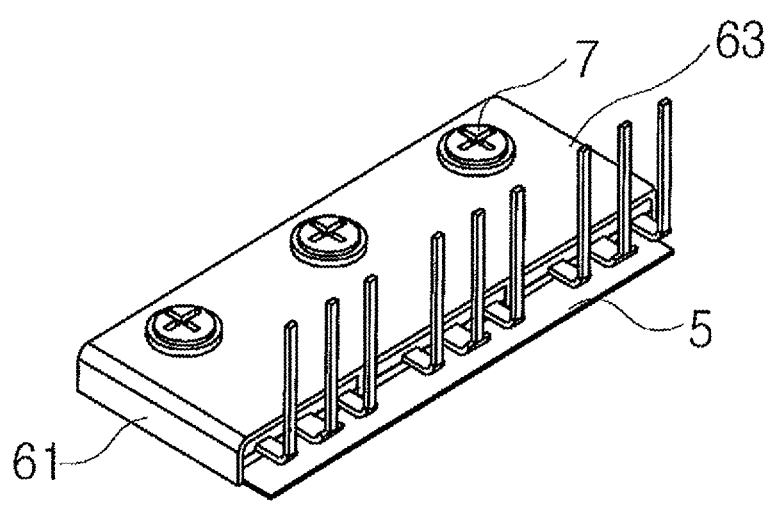

FIGS. 5 to 7 are perspective views illustrating the heat dissipation cover 6 in accordance with the first embodiment of the present invention.

The heat dissipation cover 6 in accordance with the present embodiment is configured to be open on the lower and front portions thereof. The open front portion of the heat dissipation cover 6 refers to a portion which is open and exposed to the outside so as to allow a plurality of the terminals 2a, 2b, and 2c for signal input and output to extend outside the heat dissipation cover 6.

The open lower portion of the heat dissipation cover 6 refers to a portion which is exposed to the outside so as to allow each of the inverter element 2 to be fixed to the seating surface 1a of the inverter housing 1 with the insulation sheet 5 attached to the lower surface of the inverter element 2.

The heat dissipation cover 6 includes at least one partition plate 62, which is disposed between the left side plate 61a and the right side plate 61b and partitions the receiving space 64 into a plurality of portions. In the present embodiment, each heat dissipation cover 6 includes two partition plates 62 which are spaced apart from each other to provide partitioned spaces with the same interval so that three of the inverter elements 2 can be received in the respective partitioned spaces forming the receiving spaces 64.

To enhance the thermal conductivity of the inverter elements 2 through the partition plates 62, each partition plate 62 is configured such that an upper end thereof is coupled to the inner surface of the upper plate 63 of the heat dissipation cover 6, and a lower end thereof is brought into contact with the seating surface 1a of the inverter housing 1.

Figure 8:
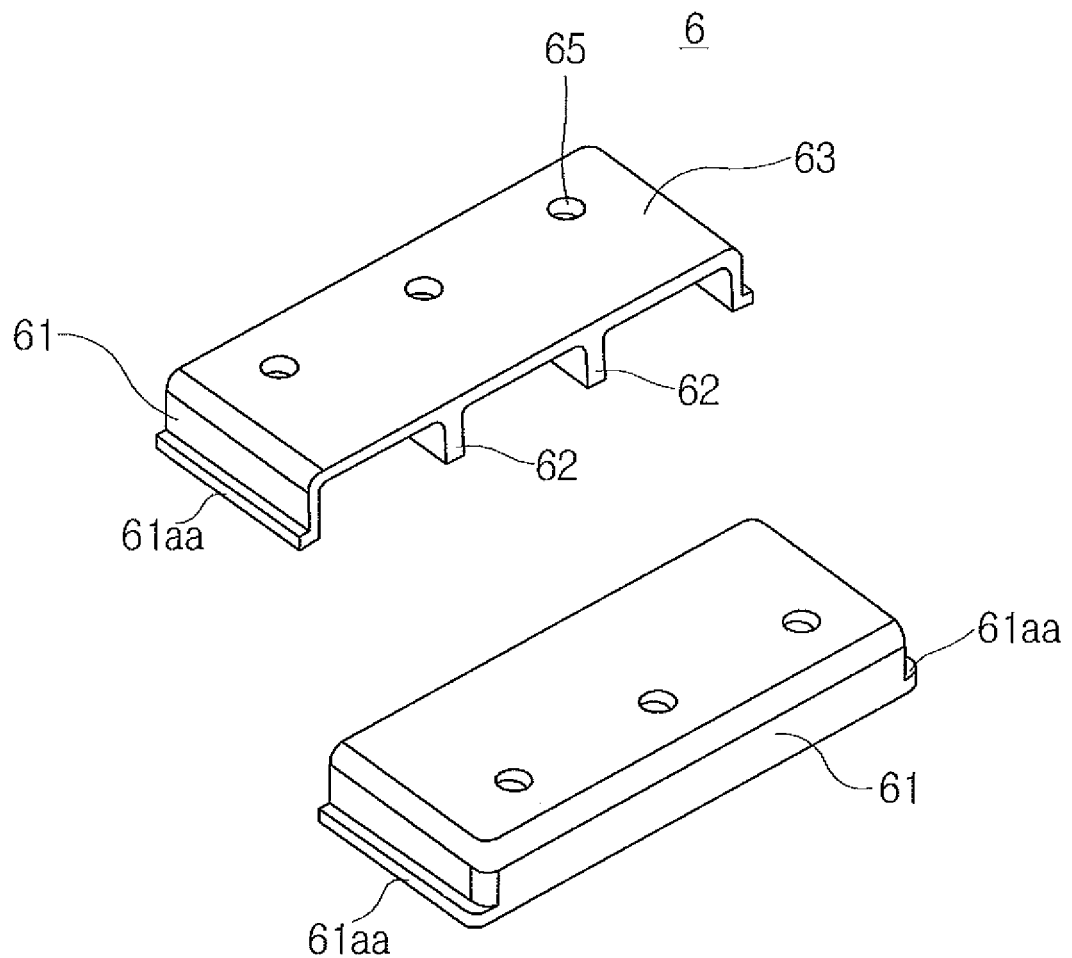
FIG. 8 is a perspective view showing the heat dissipation cover including a first extension part in accordance with the first embodiment of the present invention.

Referring to FIG. 8, the heat dissipation cover 6 may include an additional configuration so as to enhance the heat conduction efficiency between the heat dissipation cover 6 and the seating surface 1a of the inverter housing 1. For the heat dissipation cover 6 in accordance with the present embodiment, at least one of the lower ends of the left and right side plates 61a and 61b and the lower end of the rear side plate 61c, which make direct contact with the seating surface 1a of the inverter housing 1, includes a first extension part 61aa which comes into contact with the seating surface 1a of the inverter housing 1 and extends in a direction approximately parallel to the seating surface 1a.

FIG. 8 illustrates the embodiment in which, among the side plates 61 of the heat dissipation cover 6, the lower ends of only the left and right side plates (61a and 61b of FIG. 5) are provided with the first extension parts 61aa, but the present invention is not limited to this embodiment. For example, an embodiment in which the lower end of only the rear side plate 61 (61c of FIG. 6) is provided with an first extension part 61aa, and an embodiment in which all of the left, right, and rear side plates (61a, 61b, and 61c of FIGS. 5-6) are provided with first extension parts 61aa should be regarded as falling within the bounds of the present invention.

As such, due to the configuration including the first extension part 61aa, a heat conduction area between the heat dissipation cover 6 and the seating surface 1a of the inverter housing 1 is increased, whereby the efficiency of cooling the inverter elements 2 can be enhanced.

Figure 9:
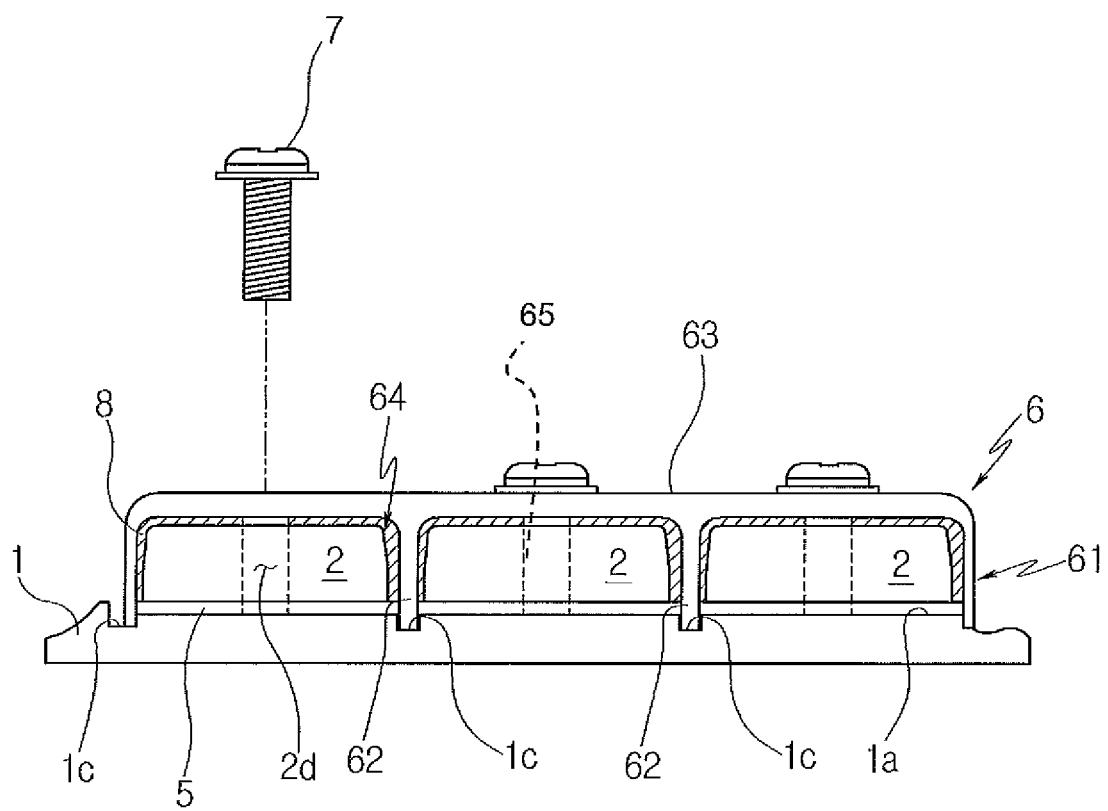
FIG. 9 is a sectional view showing the heat dissipation cover and a seating surface of an inverter housing in accordance with the first embodiment of the present invention.

FIG. 9 is a sectional view illustrating the heat dissipation cover 6 and the seating surface 1a of an inverter housing 1 in accordance with the present invention.

Referring to FIG. 9, the seating surface 1a of the inverter housing 1 in accordance with the present invention is formed with a depression 1c into which the lower ends of the left and right side plates 61a and 61b and the lower end of the rear side plate 61c of the heat dissipation cover 6 are inserted.

That is, in order to increase the contact area with which the lower ends of the left and right side plates 61a and 61b and the lower end of the rear side plate 61c of the heat dissipation cover 6 make contact with the seating surface 1a of the inverter housing 1, the present invention may be configured such that the depression 1c having a predetermined depth is formed in the seating surface 1a in a shape corresponding to that of the lower ends of the left and right side plates 61a and 61b and the lower end of the rear side plate 61c of the heat dissipation cover 6, and the lower ends of the left and right side plates 61a and 61b and the lower end of the rear side plate 61c of the heat dissipation cover 6 are inserted into the depression 1c.

Due to the depression 1c, the heat transfer area between the heat dissipation cover 6 and the seating surface 1a can not only be increased but the installation location of the heat dissipation cover 6 can also be guided during a process of assembling the heat dissipation cover 6.

Furthermore, the present invention may be configured such that the depression 1c into which the lower ends of the partition plates 62 of the heat dissipation cover 6 are inserted is formed whereby the heat transfer area between the heat dissipation cover 6 and the seating surface 1a can be further increased.

While only the configuration in which the upper surface of each of the inverter element 2 make direct contact with the inner surface of the upper plate 63 of the heat dissipation cover 6 has been illustrated, the present invention may be configured such that a predetermined gap is present between the upper surface of the inverter element 2 and the inner surface of the upper plate 63 of the heat dissipation cover 6, and a filler 8 having a predetermined thermal conductivity is applied in the gap.

Shown herein is a configuration in which gaps are present between the upper surface of the inverter element 2 and the inner surface of the upper plate 63 of the heat dissipation cover 6 and between the side surfaces of the inverter element 2 and the side plates 61 of the heat dissipation cover 6, and the fillers 8 are applied in the gaps.

Any material can be used as the material of the filler 8 without restriction so long as it can firmly attach the inverter element 2 to the inner surface of the heat dissipation cover 6 and has a predetermined thermal conductivity or more. Preferably, the filler 8 may contain a predetermined content of silicon.

In such a configuration, the contact area between the upper surface of the inverter element 2 and the inner surface of the heat dissipation cover 6 can be maximized by the filler 8, whereby the efficiency of cooling the inverter element 2 can be further enhanced.

Furthermore, after the inverter elements 2 have been previously attached to the heat dissipation cover 6 by the filler 8 prior to assembling the heat dissipation cover 6 with the inverter, the inverter elements 2 may be installed in the inverter housing 1. In this way, the inverter elements 2 can be modularized. Therefore, unlike the conventional technique, a separate jig can be omitted, and thus the process of manufacturing the electric compressor can be simplified.

An insulation sheet 5 may be provided between the lower surface of at least one inverter element 2 and the seating surface 1a. Furthermore, the present invention may be configured such that the insulation sheet 5 is omitted between the at least one heat dissipation cover 6 and the seating surface 1a.

A plurality of the bolts 7 for fixing the inverter elements is used as it is, and the upper plate 63 of the heat dissipation cover 6 is formed with bolt holes 65, which are concentric with respective coupling hole 2d (refer to FIG. 9) of the inverter elements 2 through which the corresponding bolts 7 pass. Therefore, operation of setting the locations of the inverter elements 2 and operation of fixing the inverter elements 2 to the seating surface 1a of the inverter housing 1 can be performed at the same time by the single heat dissipation cover 6.

As at least one of the bolts 7 is tightened to fix the inverter element 2 to the seating surface 1a, the surface of the inverter element 2 that faces the heat dissipation cover 6 can transfer heat in a state in which it is in close contact with the heat dissipation cover 6, and, simultaneously, heat generated from the inerter element 2 can be conducted to the heat dissipation cover 6 through the bolt 7 tightened into the corresponding coupling hole 2d. Consequently, the heat transfer performance can be enhanced. Moreover, as the bolt 7 is tightened in the above-mentioned manner, the heat dissipation cover 6 can be coupled to the outer surface of the inverter element 2 while making maximally close contact with each other. Thus, the contact force is enhanced, whereby heat transfer efficiency through the inverter element 2 is enhanced, and the heat dissipation effect is consequently improved.

Figure 10:
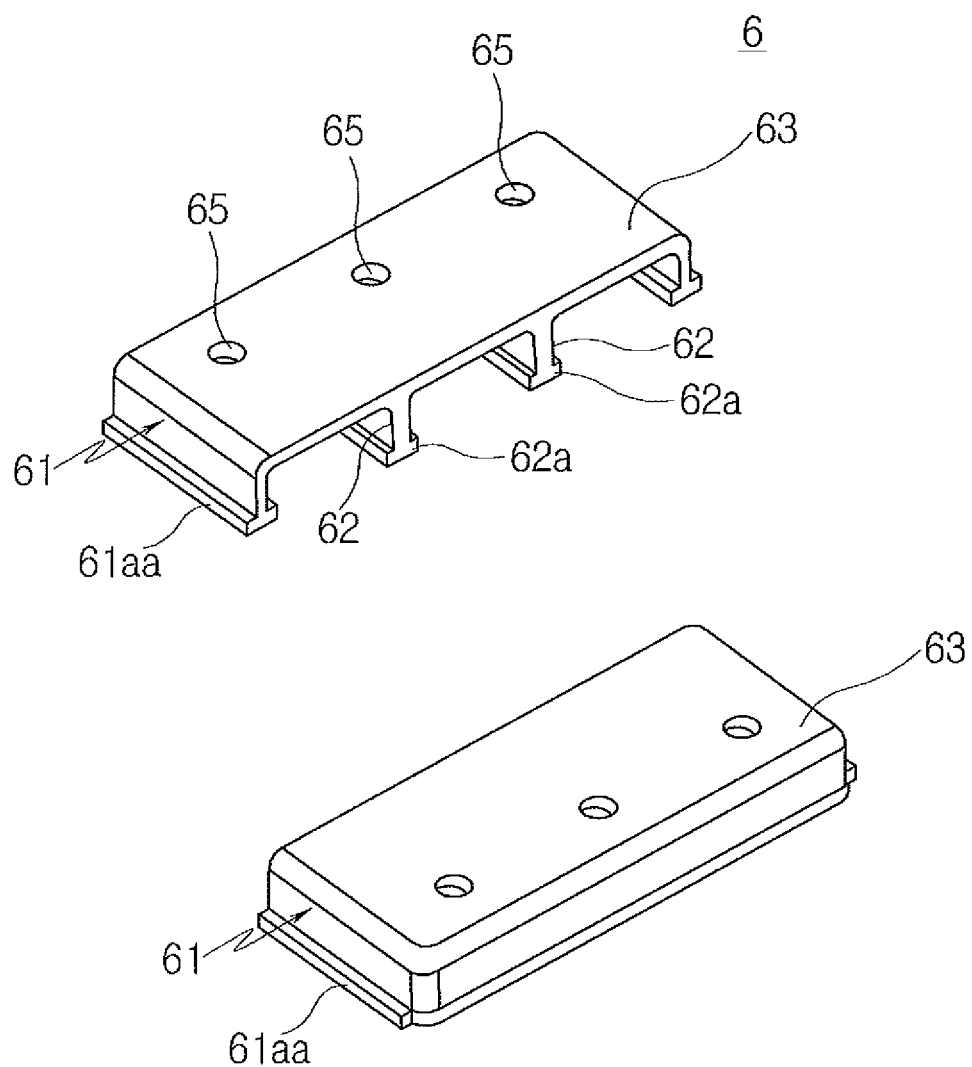
FIG. 10 is a perspective view showing the heat dissipation cover including a second extension part in accordance with the first embodiment of the present invention.

Referring to FIG. 10, the heat dissipation cover 6 further includes a second extension part 62a which extends from the lower end of each partition plate 62 in a direction parallel to the seating surface 1a of the inverter housing 1 and comes into direct contact with the seating surface 1a of the inverter housing 1.

Although the configuration has been illustrated in which the first extension parts 61aa are provided on the respective lower ends of the left and right side plates (61a and 61b of FIG. 5) of the side plates 61 of the heat dissipation cover 6 and the second extension parts 62a are provided on the respective lower ends of the partition plates 62, the present invention is not limited to this. For example, an embodiment in which only the respective lower ends of the partition plates 62 are provided with the second extension parts 62a should be regarded as falling within the bounds of the present invention.

As such, due to the configuration including the second extension parts 62a on the lower ends of the partition plates 62 as well as including the first extension parts 61aa, a heat conduction area between the heat dissipation cover 6 and the seating surface 1a of the inverter housing 1 is further increased, whereby the efficiency of cooling the inverter elements 2 can be further enhanced.

Figure 11:
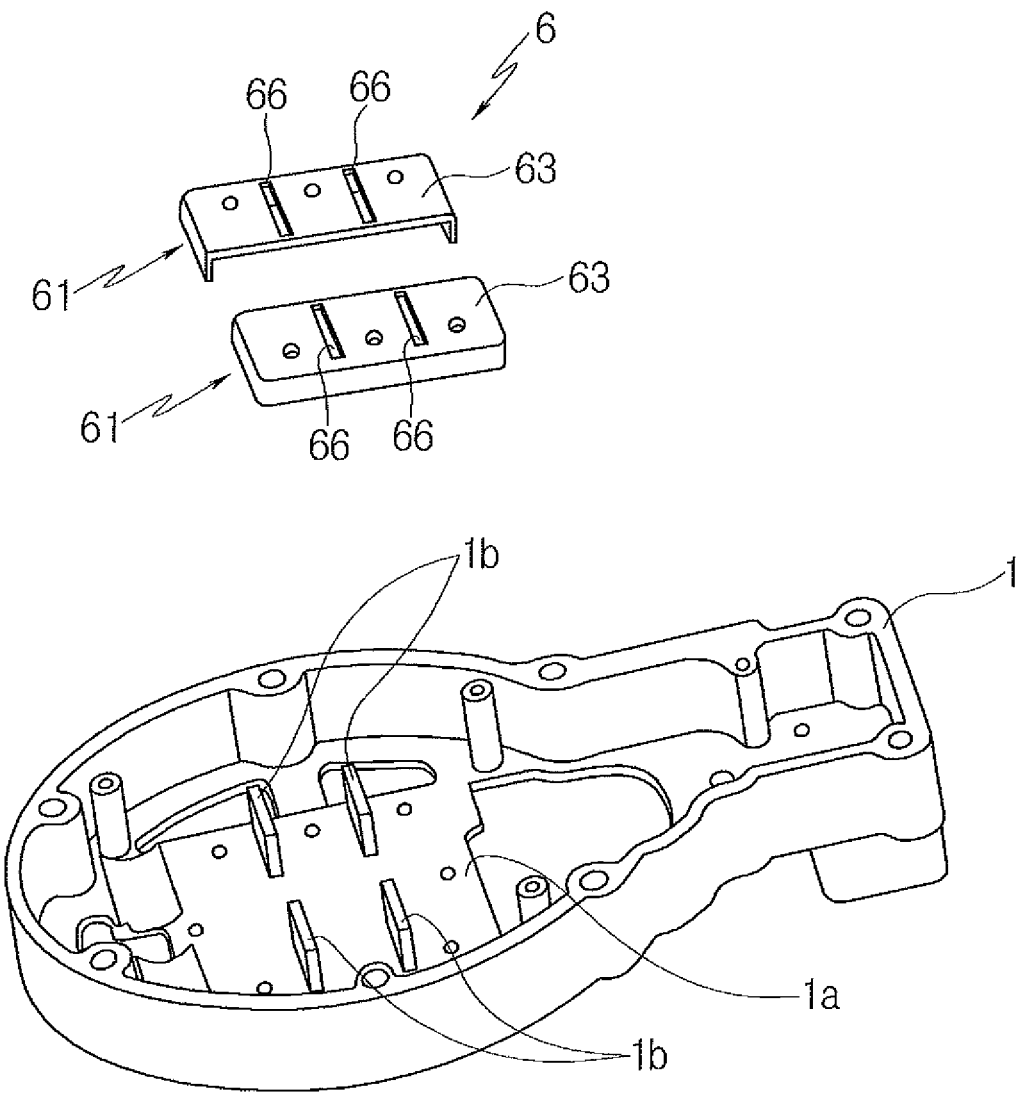
FIG. 11 is an exploded perspective view showing the heat dissipation cover formed with a guide slit in accordance with the first embodiment of the present invention.

FIG. 11 is a perspective view illustrating the inverter housing 1 provided with a guide plate 1b and the heat dissipation cover 6 having a guide slit 66 in accordance with another embodiment of the present invention. The present embodiment is characterized in that the guide plate 1b is located in the heat dissipation cover 6 that is in close contact with a plurality of the inverter elements 2 so that the space in the heat dissipation cover 6 is partitioned into a plurality of individual spaces, whereby improvement in the heat dissipation performance by an increase in contact area can be realized, and the coupling force with the inverter elements 2 can be more reliably enhanced.

Referring to FIG. 11, the inverter housing 1 further includes at least one guide plate 1b which extends from the seating surface 1a toward the upper surface 63 of the heat dissipation cover 6. The receiving space 64 of the inverter element 2 is divided by the at least one guide plate 1b into a plurality of portions. The upper plate 63 of the heat dissipation cover 6 is formed with at least one of the guide slits 66 through which the at least one guide plate 1b passes and extends.

The guide plate 1b may be integrally provided on the seating surface 1a of the inverter housing 1 or, alternatively, manufactured as a separate part and then fixed to the seating surface 1a so as to reduce the production cost of the inverter housing 1.

As such, in the case where the guide plate 1b is provided on the seating surface 1a of the inverter housing 1 such that the partition plate 62 is omitted from the heat dissipation cover 6, the configuration of the heat dissipation cover 6 can be simplified, thus making it possible to enhance the productivity of the heat dissipation cover 6 and reduce the production cost of the heat dissipation cover 6.

The present embodiment is characterized in that an auxiliary heat dissipation part is formed to enhance the heat dissipation performance of the heat dissipation cover so that heat can be reliably conducted from the inverter element to the heat dissipation cover.

Figure 12:
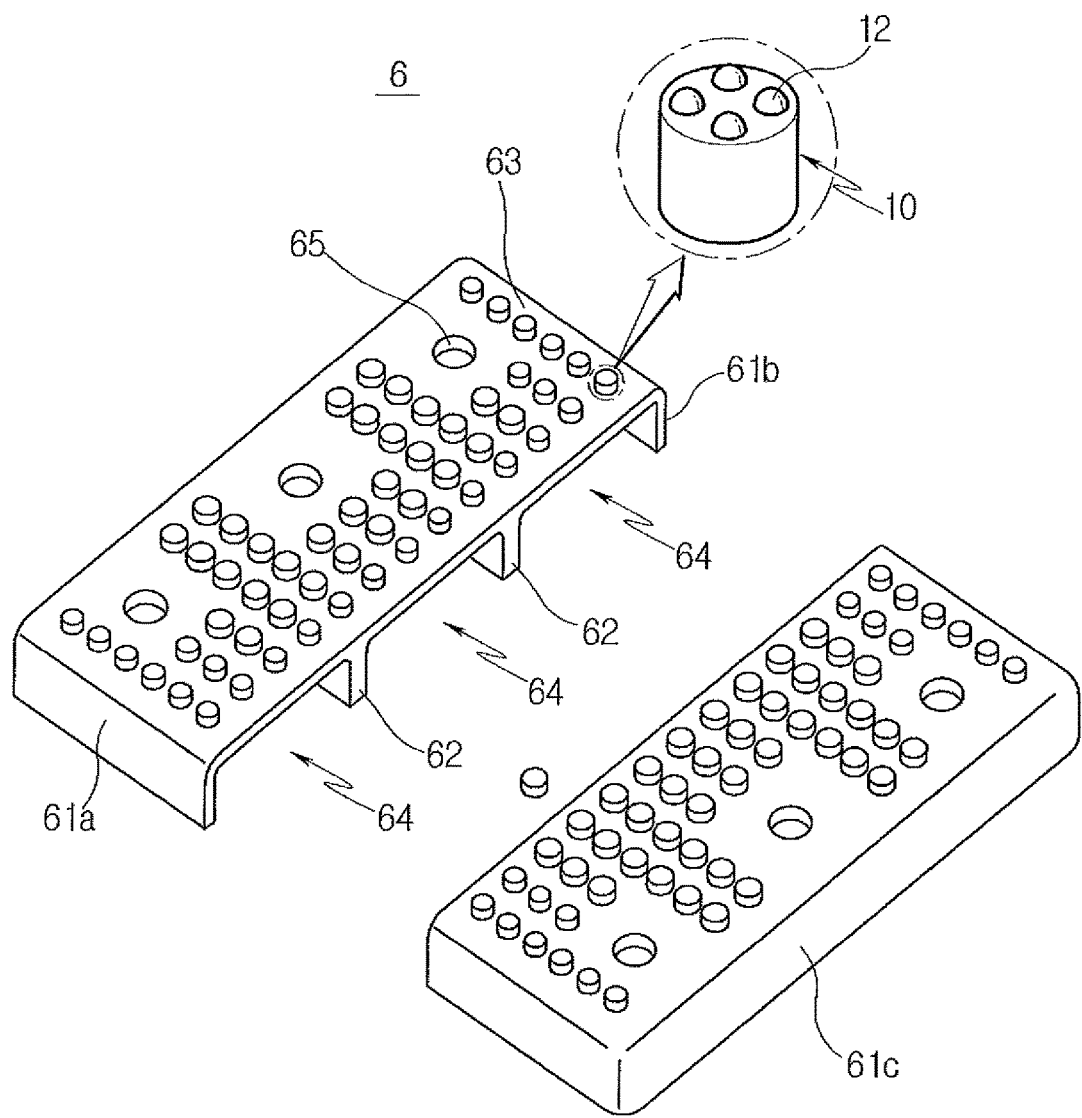
FIG. 12 is an exploded perspective view showing a heat dissipation cover provided with an auxiliary heat dissipation part in accordance with the present invention.

Referring to FIG. 12, the electric compressor in accordance with the present invention includes (as illustrated in FIGS. 1-2) the main housing 4 which has therein a suction chamber into which low-temperature refrigerant is drawn; the inverter housing 1 which includes the internal seating surface 1a formed adjacent to the suction chamber, and which is provided with at least one of the inverter elements 2 fixed at a surface thereof to the internal seating surface 1a while making contact with the internal seating surface 1a so that heat is conducted from the inverter housing 1 to the main housing 4; and the at least one heat dissipation cover 6, which is disposed toward the main housing 4 while facing another surface of the inverter element 2 and enclosing the inverter element 2, and which has therein the receiving space 64 in which the inverter element 2 is received. The at least one heat dissipation cover 6 includes auxiliary heat dissipation parts 10 which protrude outward from the heat dissipation cover 6 so as to dissipate heat generated from the inverter element 2.

The auxiliary heat dissipation parts 10 may be formed on the upper plate 63, the left side plate 61a, and the right side plate 61b, or, alternatively, formed on all of the upper plate 63, the left side plate 61a, the right side plate 61b, and the rear side plate 61c. The auxiliary heat dissipation parts 10 may comprise a plurality of protrusions each having a predetermined diameter, or may be arranged in the lateral direction of the upper plate 63 and protrude a predetermined length with different diameters.

The auxiliary heat dissipation parts 10 in accordance with the present embodiment are formed on the upper surface of the upper plate 63. The shape of each auxiliary heat dissipation part 10 may be changed in a variety of forms rather than being limited to that illustrated in the drawing, but in the present embodiment, it has a form of a cylindrical protrusion with a predetermined diameter.

The auxiliary heat dissipation parts 10 function to dissipate heat conducted from the inverter element 2 to the upper plate 63 and thus cool the inverter element 2.

The auxiliary heat dissipation parts 10 may be formed on the upper plate 63, the left side plate 61a, and the right side plate 61b, or, alternatively, formed on all of the upper plate 63, the left side plate 61a, the right side plate 61b, and the rear side plate 61c. The length to which each auxiliary heat dissipation part 10 protrudes may be changed depending on a layout of elements around the heat dissipation cover 6.

The auxiliary heat dissipation parts 10 in accordance with the present embodiment may have different diameters. In this case, depending on heat generation distribution of the inverter element 2, the auxiliary heat dissipation parts 10 may be arranged in such a way that a region to which high-temperature heat is transferred is formed with the auxiliary heat dissipation parts 10 having a larger diameter than that of the auxiliary heat dissipation parts 10 disposed in perimeter regions, while a region to which a comparatively small amount of heat is transferred is formed with the auxiliary heat dissipation parts 10 having a relatively small diameter.

In this case, the maximum heat dissipation effect can be obtained in the limited area of the heat dissipation cover 6. Hence, heat generated from the inverter element 2 can be more reliably dissipated.

Each auxiliary heat dissipation part 10 may further include a heat dissipation protrusion 12 formed on an upper surface thereof. The heat dissipation protrusion 12 may have either a semicircular shape or an elliptical shape and be preferably formed in a shape shown in the drawing so as to increase the heat dissipation area. The number of heat dissipation protrusions 12 is not limited, and may be changed in various ways.

Figure 13:
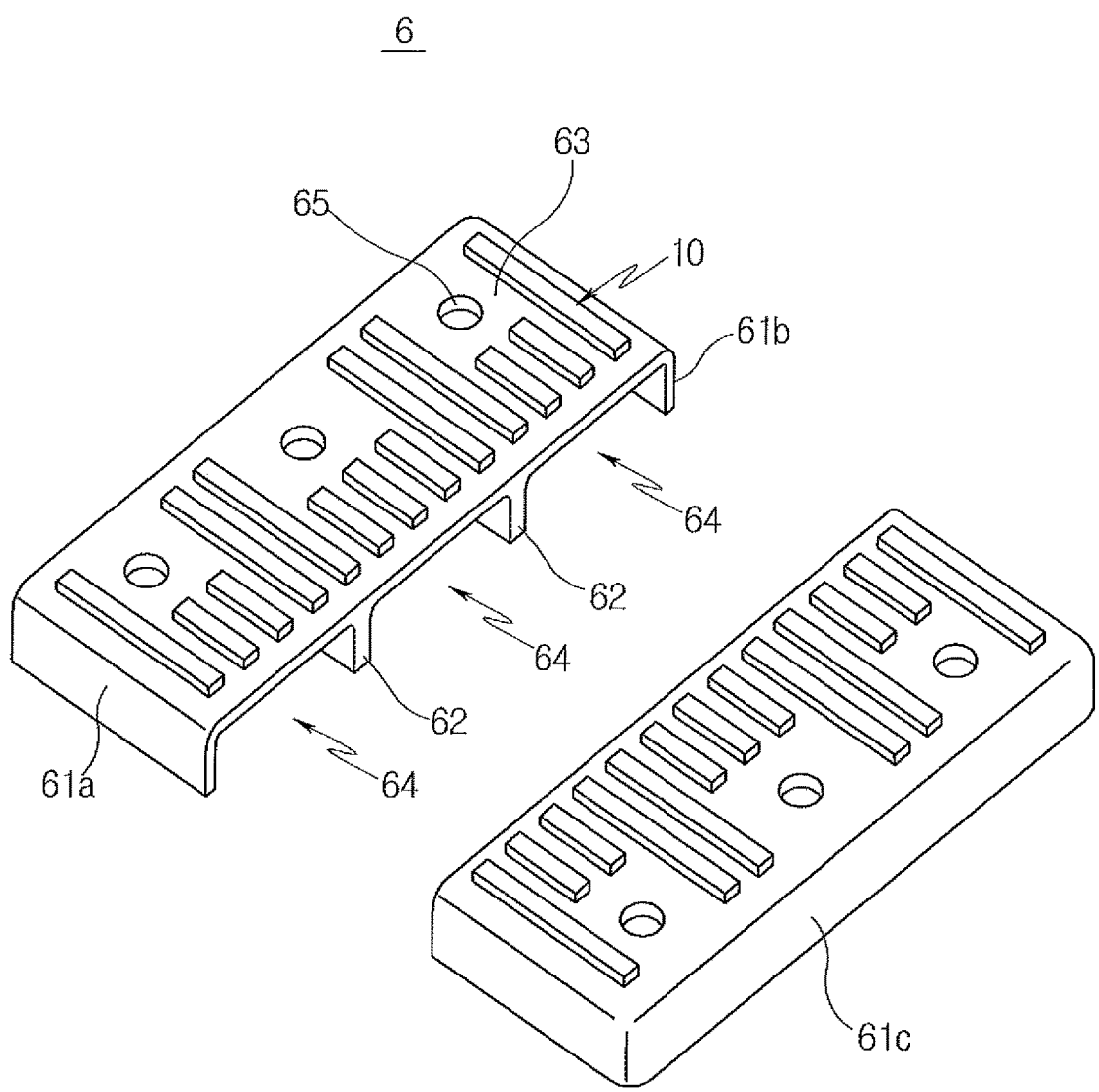
FIG. 13 is an exploded perspective view showing a modification of FIG. 12.

Referring to FIG. 13, the auxiliary heat dissipation parts 10 may comprise a plurality of protrusions, which protrude at positions spaced apart from each other, and each of which has a predetermined diameter. Alternatively, each auxiliary heat dissipation part 10 may protrude and extend a predetermined length in the lateral direction of the upper plate 63. A difference from the preceding embodiment is that each auxiliary heat dissipation part 10 extends a predetermined length corresponding to or shorter than the width of the upper plate 63 so as to increase the heat dissipation area. Thereby, the heat dissipation area, with which heat generated from the inverter elements 2 is dissipated, is increased compared to the preceding embodiment. Consequently, a larger amount of heat can be dissipated into the air so that the efficiency of cooling the inverter elements 2 can be further enhanced.

Figure 14:
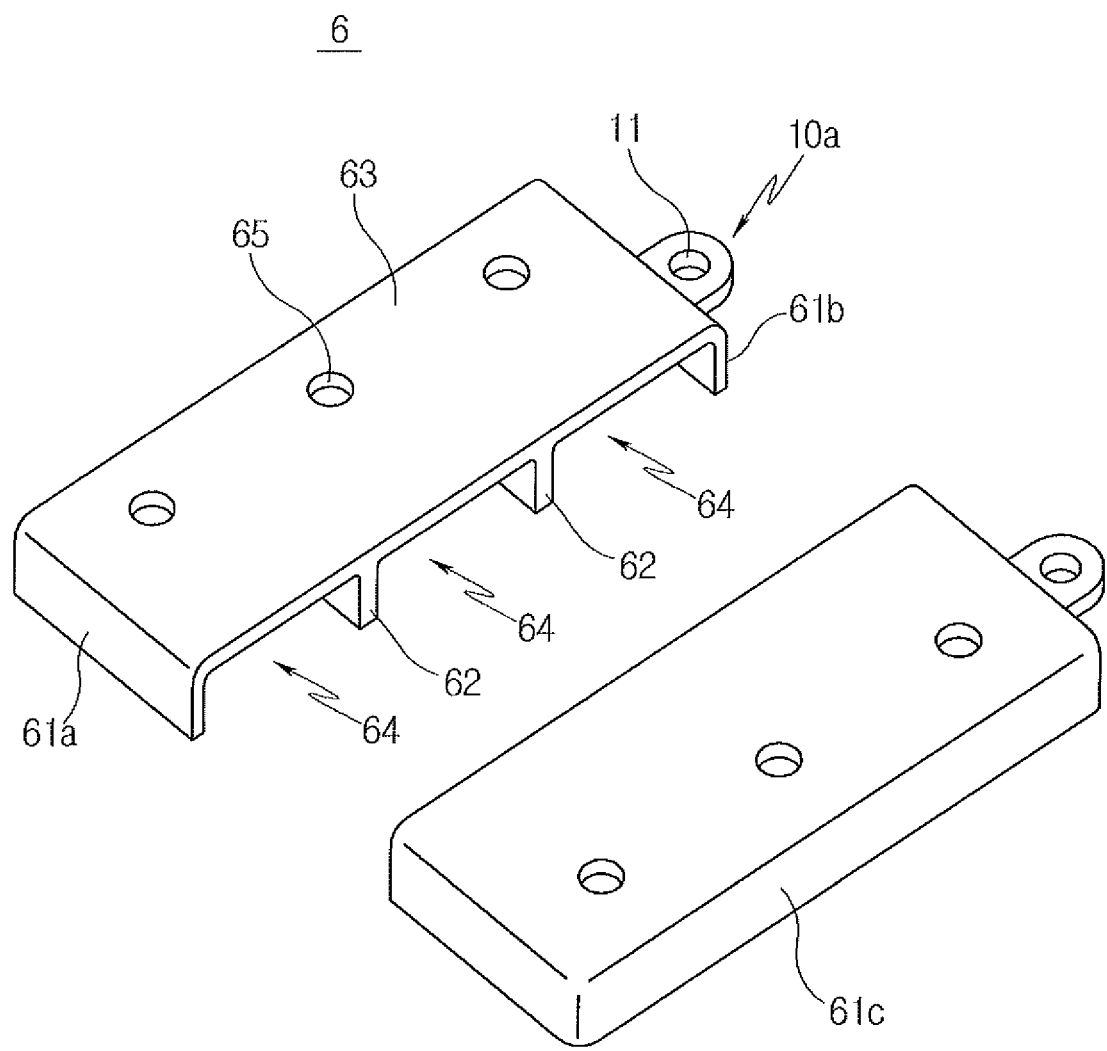
FIGS. 14 to 16 are perspective views showing various embodiments of the auxiliary heat dissipation part in accordance with the present invention.

Referring to FIG. 14, in this embodiment, so as to enhance the efficiency of dissipating heat from the inverter elements 2, the at least one heat dissipation cover 6, which is configured to cover the open upper surfaces of the inverter elements 2 and at least partially come into direct contact with the seating surface 1a of the inverter housing 1, is fixed on the seating surface 1a while making contact with the seating surface 1a. In addition, an auxiliary heat dissipation part 10a is formed to longitudinally protrude from one side of the heat dissipation cover 6 to dissipate heat generated from the inverter elements 2.

The auxiliary heat dissipation part 10a protrudes outward from either the left side plate 61a or the right side plate 61b. With regard to the position of the auxiliary heat dissipation part 10a, because the respective auxiliary heat dissipation parts of the heat dissipation covers are disposed to face each other, each auxiliary heat dissipation part is preferably formed at the same position on the corresponding heat dissipation cover.

The auxiliary heat dissipation part 10a horizontally extends outward for the heat dissipation cover 6 and includes an insert hole 11, which is open toward the seating surface 1a, and into which at least one bolt is inserted. By the bolt inserted through the insert hole 11, the heat dissipation cover 6 can be more stably fixed, and the heat dissipation area can be increased so that heat generated from the inverter elements 2 can be more effectively dissipated. That is, improvement in both fixation stability and heat dissipation efficiency of the heat dissipation cover 6 can be achieved.

Figure 15:
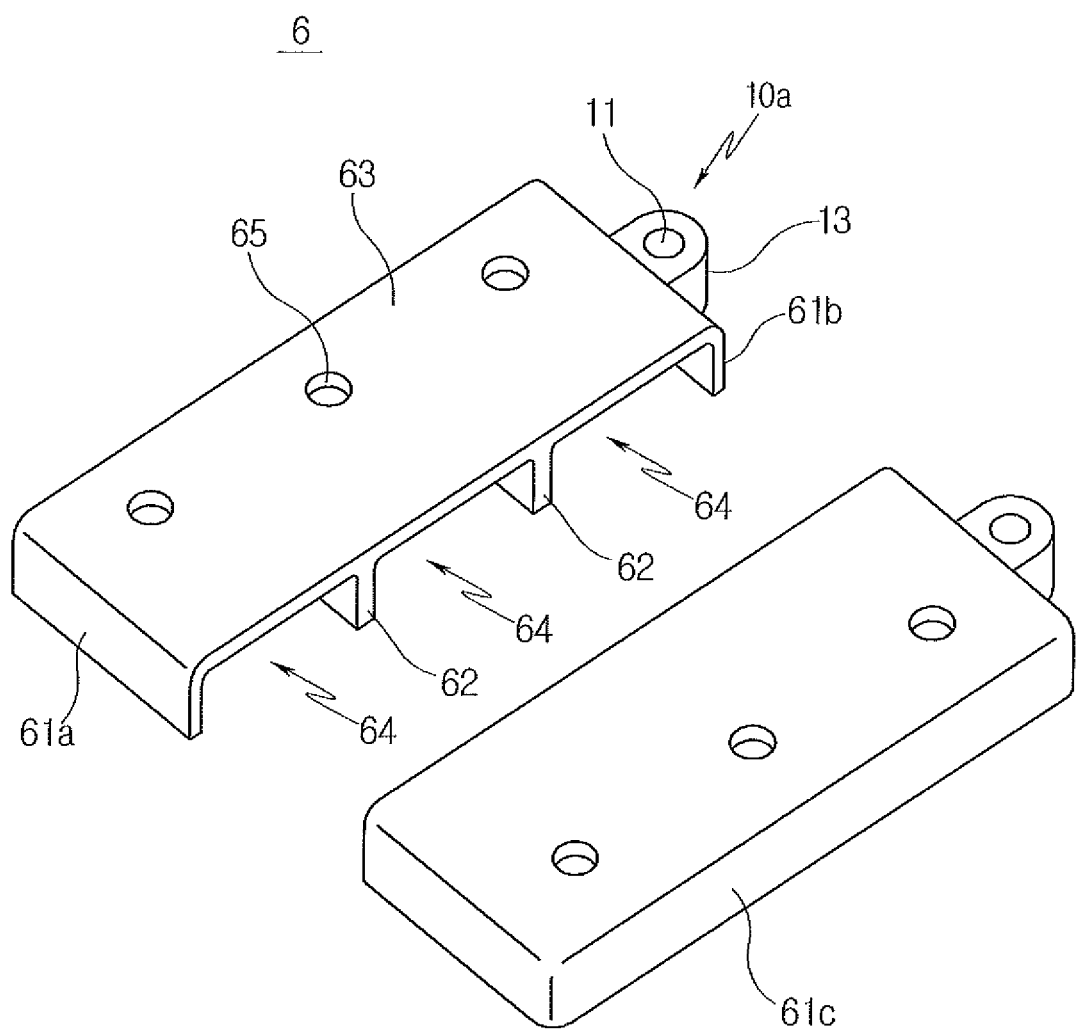

Referring to FIG. 15, the auxiliary heat dissipation part 10a may further include a boss 13 which protrudes in a lateral direction of one side of the heat dissipation cover 6 and extends toward the seating surface 1a of the heat dissipation cover 6. The boss 13 increases the heat dissipation area and guides stable insertion of a bolt, thus making it possible for a worker to more easily and rapidly perform an operation of installing the heat dissipation cover 6 on the seating surface 1a. In addition, when the heat dissipation cover 6 is fixed using the bolt inserted into the insert hole 11, the bolt is prevented from being undesirably displaced out of the insert hole 11, whereby the fixing operation can be stably and reliably performed.

In an embodiment, a plurality of the auxiliary heat dissipation parts 10a may be provided on each heat dissipation cover 6. In this case, the auxiliary heat dissipation parts 10a are arranged in a symmetrical structure so that the force of fixing the heat dissipation cover 6 as well as the heat dissipation area can be increased, whereby the heat dissipation cover 6 can be more stably fixed on the seating surface 1a.

Figure 16:
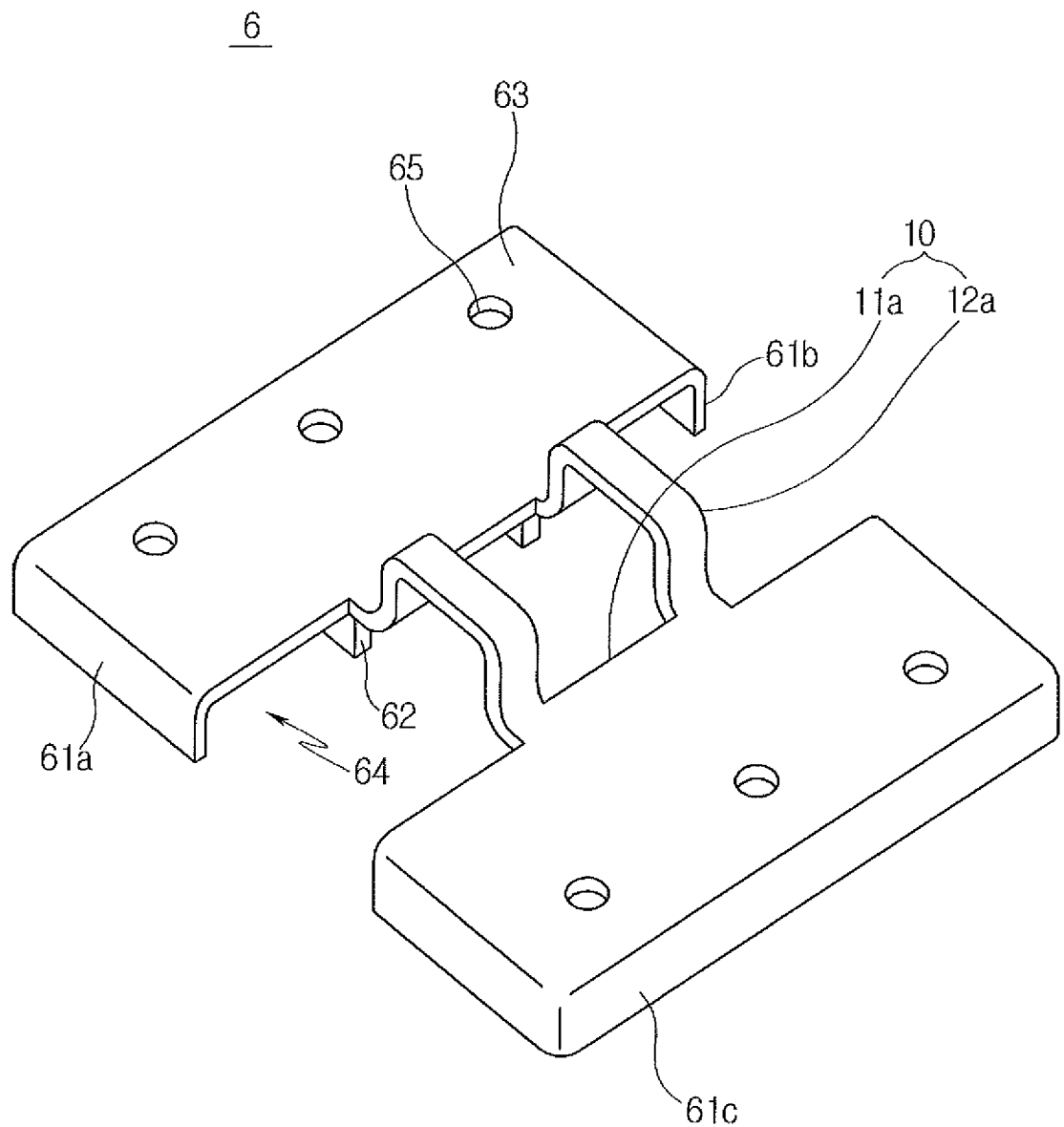

Referring to FIG. 16, the auxiliary heat dissipation part 10 may include an extension part 11a which extends along a section of a longitudinal portion of each of the heat dissipation covers 6 that are disposed to face each other, and a connection part 12a which is bent upward from both ends of the extension part 11a of one heat dissipation cover 6, extends horizontally, and then is connected to the extension part 11a of the other heat dissipation cover 6.

In the present embodiment, each heat dissipation cover 6 has neither a protrusion for heat dissipation nor an auxiliary heat dissipation part on one side thereof in the longitudinal direction, but the two heat dissipation covers 6 are coupled with each other in a bridge form, thus promoting heat dissipation.

In this case, when high-temperature heat generated from some of the inverter elements 2 is intensively transferred to any one of the two heat dissipation covers that are spaced apart from each other, heat is conducted by the auxiliary heat dissipation part 10 to the other heat dissipation cover that is in a relatively low-temperature state, so as to form the thermal equilibrium state. Hence, excessive heat generated from any one heat dissipation cover that is in a high-temperature state can be reliably relieved.

Thus, the inverter elements 2 can be prevented from overheating, whereby the reliable operation of the electric compressor is promoted. In addition, even when the electric compressor is used under high-temperature conditions, a malfunction of the electric compressor can be minimized.

In this embodiment, a plurality of the connection parts 12a may be arranged along the extension parts 11a, and the number of connection parts 12a may be changed. Furthermore, given the distance between the heat dissipation covers 6 and the peripheral layout, the connection part 12a can not only have a shape shown in the drawing but the shape thereof can also be changed into other shapes, in other words, it is not limited to the shape shown in the drawing.

Hereinafter, an electric compressor in accordance with a second embodiment of the present invention will be described with reference to the related drawing. The heat dissipation cover in accordance with the present embodiment is similar in basic concept to that of the preceding embodiments in that the heat dissipation cover 6 receives heat generated from an inverter module and dissipates it. However, in the present embodiment, as no partition plate is provided in the heat dissipation cover, a plurality of unit inverters may be integrated into one unit and modularized to form a single inverter module, and heat dissipation for the single inverter module can be reliably performed.

For reference, the an inverter module 2 described in the present embodiment is formed in such a way that six unit inverter, which are provided as shown in FIG. 3, are integrated into a module form. The description provided hereinafter with reference to FIGS. 17 and 18 will use the reference numeral "2" to describe the inverter module. Therefore, even when the size of the seating surface 1a is relatively small, the inverters can be easily installed. Furthermore, the size of the inverter housing 1 is compact, so that even if space in which the electric compressor is installed is small, the worker can easily perform the operation of installing the electric compressor.

Furthermore, as the entire size of the inverter module 2 is small and compact, generated heat is also relatively reduced. Consequently, the elements can be prevented being damaged due to high temperature, and a malfunction occurrence frequency can be minimized.

Figure 17:
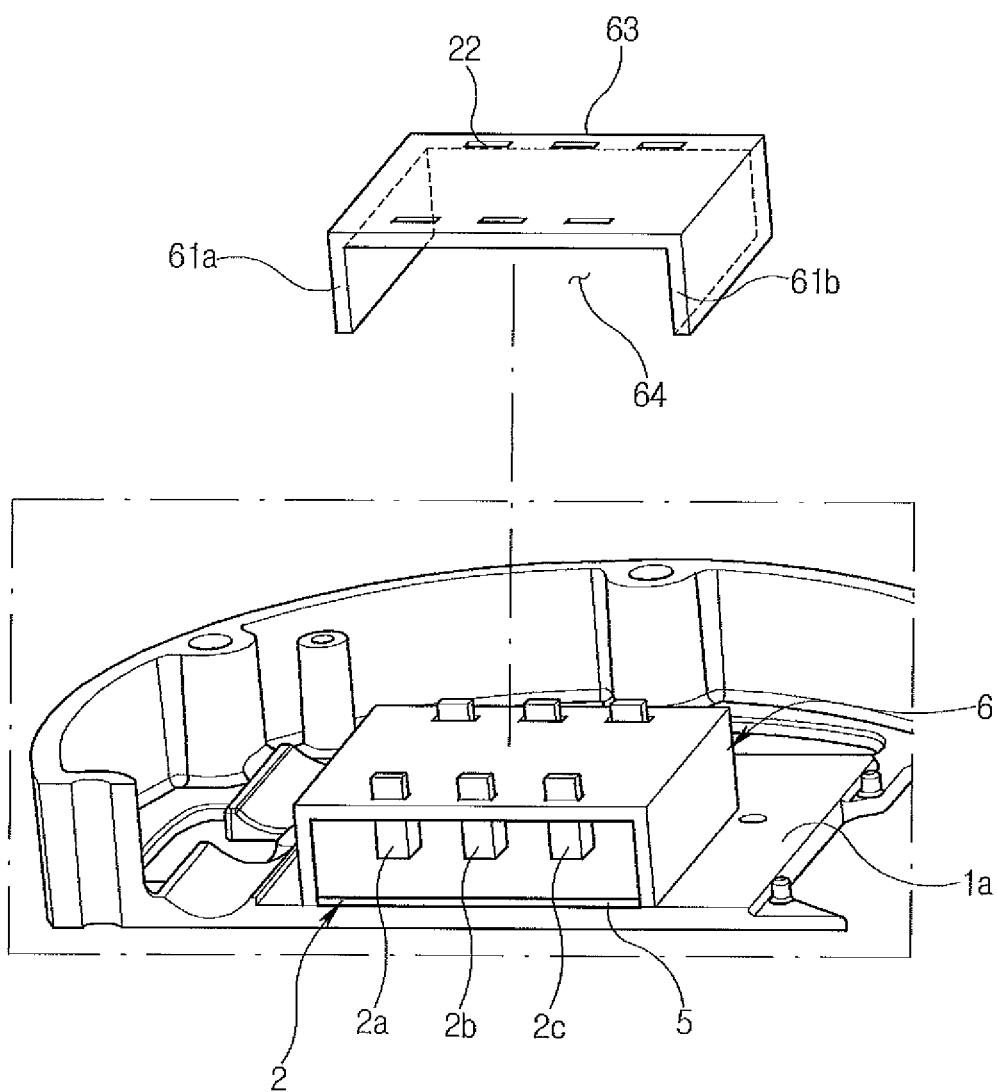
FIG. 17 is a perspective view illustrating a heat dissipation cover in accordance with a second embodiment of the present invention.

Referring to FIG. 17, and as illustrated in FIGS. 1-2, the electric compressor in accordance with the present embodiment includes the main housing 4 which has therein a suction chamber into which low-temperature refrigerant is drawn; the inverter housing 1 which includes the internal seating surface 1a formed adjacent to the suction chamber, and which is provided with at least one of the inverter module 2 fixed at a surface thereof to the internal seating surface 1a while making contact with the internal seating surface 1a, wherein the inverter module 2 conducts heat to the main housing 4, is disposed on an upper surface of the insulation sheet 5 disposed on the seating surface 1a, and is provided with the terminals 2a, 2b, and 2c extending upward for signal input and output; and the at least one heat dissipation cover 6 which is disposed toward the main housing 4 while facing another surface of the inverter module 2 and enclosing the inverter module 2, and which has therein the receiving space 64 in which the inverter module 2 is received. The heat dissipation cover 6 has open holes 22, the number of which corresponds to the number of the terminals 2a, 2b, and 2c, and which are formed at positions facing the respective terminals 2a, 2b, and 2c so that the terminals 2a, 2b, and 2c are inserted into the corresponding open holes 22.

To more rapidly dissipate heat generated from the inverter module 2, the heat dissipation cover 6 is configured to come into close contact with the inverter module 2, as shown in the drawing. The open holes 22 are formed in the upper surface of the heat dissipation cover 6 such that the terminals 2a, 2b, and 2c are inserted into the respective open holes 22. Particularly, the terminals 2a, 2b, and 2c are maintained in a state in which they have been inserted into the open holes 22.

The open holes 22 are formed at positions corresponding to the terminals 2a, 2b, and 2c, and the number of the open holes 22 also correspond to the number of the terminals 2a, 2b, and 2c. Therefore, regardless of the number of the terminals 2a, 2b, and 2c, the heat dissipation cover can be maintained in close contact with the outer surface of the inverter module 2.

Thereby, even when the inverter module 2 is operated in a high temperature state, high heat transfer performance can be secured because the close contact state is maintained. Therefore, conditions in which heat can be dissipated to the outside can be stably maintained.

Hereinafter, an electric compressor according to a third embodiment of the present invention will be described with reference to the related drawing. For reference, the third embodiment is characterized in that: an extension part 70 is formed on the heat dissipation cover 6 to increase the heat dissipation area and thus rapidly dissipate heat generated from the inverter module 2 so that the inverter module can be prevented from being damaged by heat and the electric compressor can be fundamentally prevented from malfunctioning due to heat; and the terminals 2a, 2b, 2c are drawn out in such a way that they pass through the heat dissipation cover or extend sideways out of the heat dissipation cover.

Figure 18:
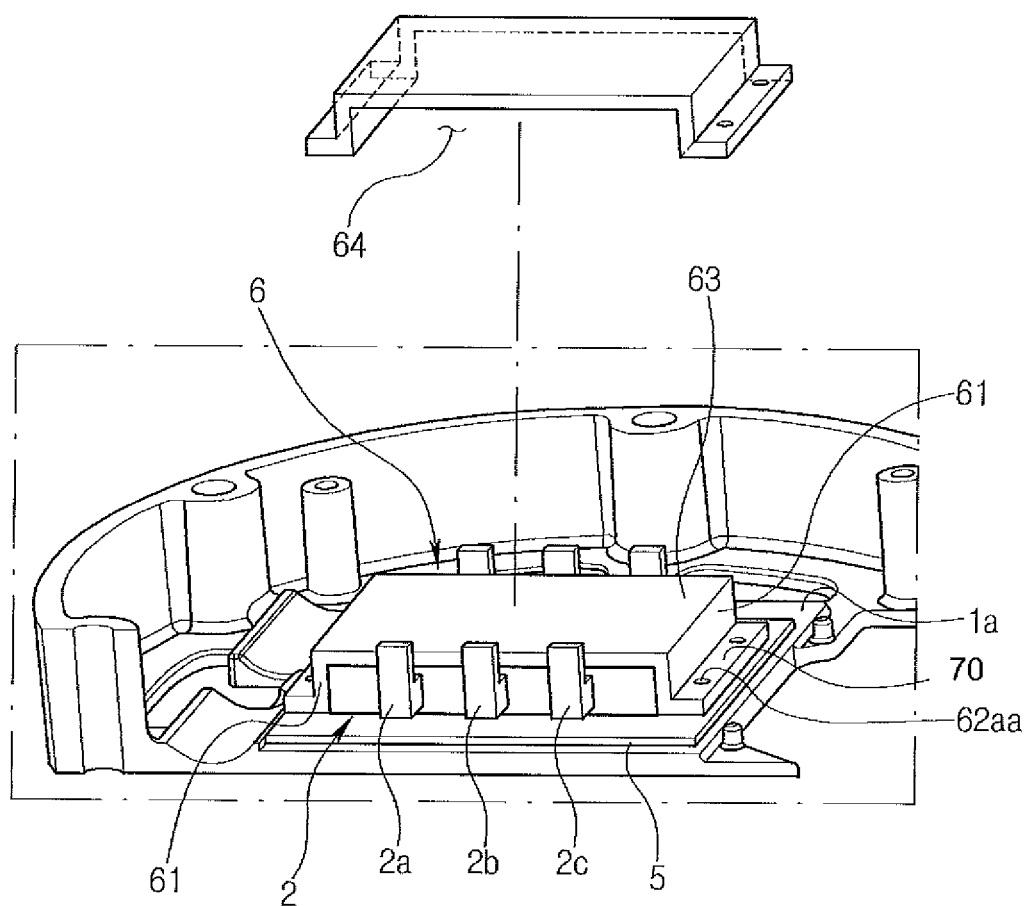
FIG. 18 is a perspective view illustrating a heat dissipation cover in accordance with a third embodiment of the present invention.

Referring to FIG. 18, and as illustrated in FIGS. 1-2, the electric compressor in accordance with the present embodiment includes the main housing 4 which has therein a suction chamber into which low-temperature refrigerant is drawn; the inverter housing 1 which includes the internal seating surface 1a formed adjacent to the suction chamber, and which is provided with at least one of the inverter modules 2 fixed at a surface thereof to the internal seating surface 1a while making contact with the internal seating surface 1a, wherein the inverter module 2 conducts heat to the main housing 4, is disposed on an upper surface of the insulation sheet 5 disposed on the seating surface 1a, and is provided with the terminals 2a, 2b, and 2c extending upward for signal input and output; and the at least one heat dissipation cover 6 which is disposed toward the main housing 4 while facing the other surface of the inverter module 2 and enclosing the inverter module 2, and which has therein the receiving space 64 in which the inverter module 2 is received. The heat dissipation cover 6 is open on front and rear portions thereof, and the at least one inverter element 2 is provided with the at least one or more terminals 2a, 2b, and 2c for signal input and output which extend outward through the open front and rear portions of the heat dissipation cover 6.

The heat dissipation cover 6 further includes an extension part 70 which is bent at an end thereof toward the insulation sheet 5 disposed on the upper surface of the seating surface 1a.

The extension part 70 is bent from the lower end of each of the left and right side plates 61a and 61b outward by 90 degrees, and the lower ends of the left and right side plates 61a and 61b extend to the lower surface of the inverter module 2.

In the case of the heat dissipation cover 6 having the above-mentioned configuration, heat generated from the inverter module 2 can be rapidly transferred through the heat dissipation cover 6 to the outside without a separate medium. Thereby, the heat dissipation performance can be enhanced, and elements mounted in the inverter module 2 can be prevented from being damaged by heat.

The reason why the rear portion of the heat dissipation cover is open is to rapidly transfer heat generated from the inverter module 2 to the outside through the open front and rear portions as well as using heat transfer through the heat dissipation cover 6 and thus promote the reliable operation of the inverter module 2.

The insulation sheet 5 is disposed on the upper surface of the seating surface 1a and is formed in a larger size than that of the inverter module 2. In the present embodiment, the insulation sheet 5 may be formed in a size equal to or larger than that of the heat dissipation cover 6.

INDUSTRIAL APPLICABILITY

An electric compressor in accordance with various embodiments of the present invention can effectively dissipate heat generated from an inverter element and thus be used as an electric compressor or a compressor for vehicles or an industrial compressor using refrigerant as working fluid.

The invention claimed is:

1. An electric compressor comprising:
   a main housing including a suction chamber formed therein, the suction chamber configured to receive a low-temperature refrigerant;
   an inverter housing including an internal seating surface and an inverter element disposed on the internal seating surface, the internal seating surface formed adjacent the suction chamber, the inverter element in thermal communication with the main housing;
   a heat dissipation cover disposed in the inverter housing and at least partially enclosing the inverter element, the heat dissipation cover having a receiving space receiving the inverter element; and
   at least one bolt fixing the inverter element to the internal seating surface, wherein the heat dissipation cover has at least one bolt hole through which the at least one bolt passes, wherein the inverter element has at least one coupling hole through which the at least one bolt passes, and wherein after the at least one bolt is tightened, a surface of the inverter element facing the heat dissipation cover performs heat transfer while in close contact with the heat dissipation cover while heat generated from the inverter element is conducted to the heat dissipation cover through the at least one bolt.

2. The electric compressor of claim 1, wherein the heat dissipation cover includes a first plate spaced from the internal seating surface forming an upper portion of the heat dissipation cover, a second plate extending outwardly from the first plate, a third plate extending outwardly from the first plate opposite the second plate, and a fourth plate extending outwardly from the first plate between the second plate and the third plate, the second plate forming a first side portion of the heat dissipation cover, the third plate forming a second side portion of the heat dissipation cover, and the fourth plate forming a rear portion of the heat dissipation cover, and wherein the first plate, the second plate, the third plate, and the fourth plate cooperate with each other to define the receiving space and an opening, the receiving space formed in a lower portion of the heat dissipation cover opposite the upper portion and the opening formed in a front portion of the heat dissipation cover opposite the rear portion.

3. The electric compressor of claim 2, wherein an end of at least one of the second plate, the third plate, and the fourth plate includes a first extension part, the first extension part extending parallel to the internal seating surface and contacting the internal seating surface.

4. The electric compressor of claim 3, wherein the heat dissipation cover includes an auxiliary heat dissipation part extending outwardly therefrom, the auxiliary heat dissipation part configured to dissipate heat from the inverter element.

5. The electric compressor of claim 3, wherein the heat dissipation cover includes a plurality of heat dissipation parts extending outwardly therefrom configured to dissipate heat from the inverter element, wherein the plurality of heat dissipation parts is formed on the first plate, the second plate, and the third plate, and wherein each of the plurality of the heat dissipation parts has one of a cylindrical shape and an elongate shape.

6. The electric compressor of claim 4, wherein the auxiliary heat dissipation part has a heat dissipation protrusion extending outwardly from an upper surface of the auxiliary heat dissipation part.

7. The electric compressor of claim 4, wherein the auxiliary heat dissipation part extends outwardly from one of the first side portion and the second side portion, and wherein the auxiliary heat dissipation part has a boss extending laterally outwardly from the one of the first side portion and the second side portion.

8. The electric compressor of claim 4, wherein the auxiliary heat dissipation part has an extension part extending outwardly from the front portion of the heat dissipation cover and a bent part extending outwardly from the extension part.

9. The electric compressor of claim 8, wherein the inverter element has a terminal configured for signal input and signal output, and wherein the terminal passes through the opening in the front portion of the heat dissipation cover and extends outside of the receiving space.

10. An electric compressor comprising:
a main housing including a suction chamber formed therein, the suction chamber configured to receive a low-temperature refrigerant;
an inverter housing including an internal seating surface, an insulation sheet disposed on the internal seating surface, and an inverter module disposed on the insulation sheet, the internal seating surface formed adjacent the suction chamber, the inverter module having a terminal extending outwardly therefrom, the terminal configured for signal input and signal output, the inverter module in thermal communication with the main housing; and
a heat dissipation cover disposed in the inverter housing and at least partially enclosing the inverter module, the heat dissipation cover having a receiving space and an opening formed thereon, the receiving space receiving the inverter module and the opening receiving the terminal, wherein the heat dissipation cover includes a first plate spaced from the internal seating surface forming an upper portion of the heat dissipation cover, a second plate extending outwardly from the first plate, and a third plate extending outwardly from the first plate and opposing the second plate, the second plate forming a first side portion of the heat dissipation cover, the third plate forming a second side portion of the heat dissipation cover, and wherein the first plate, the second plate, and the third plate cooperate with each other to define the receiving space and the opening, the receiving space formed in a lower portion of the heat dissipation cover opposite the upper portion and the opening formed in a front portion of the heat dissipation cover, and wherein the heat dissipation cover includes a partition plate partitioning the receiving space into a plurality of spaces, and wherein the partition plate has an extension part extending outwardly from a lower end of the partition plate, the extension part arranged parallel to the internal seating surface.

11. The electric compressor of claim 10, wherein the heat dissipation cover has the extension part extending outwardly therefrom, the extension part contacting the insulation sheet.

12. The electric compressor of claim 10, wherein the heat dissipation cover has a first heat dissipation cover portion and a second heat dissipation cover portion, the first heat dissipation cover portion having a shape corresponding to a shape of the second heat dissipation cover portion.

13. The electric compressor of claim 10, wherein the partition plate extends from the first plate towards the lower portion of the heat dissipation cover.

14. The electric compressor of claim 10, further comprising a guide plate extending outwardly from the internal seating surface towards the upper portion of the heat dissipation cover, wherein the receiving space is partitioned by the guide plate into a plurality of spaces.

15. The electric compressor of claim 14, wherein the upper portion of the heat dissipation cover has a guide slit receiving the guide plate.

16. The electric compressor of claim 10, wherein the heat dissipation cover directly contacts the internal seating surface.

17. The electric compressor of claim 10, further comprising a filler disposed intermediate an upper surface of the inverter module and an inner surface of the heat dissipation cover.

* * * * *